United States Patent
Huang et al.

(10) Patent No.: US 11,095,312 B2
(45) Date of Patent: Aug. 17, 2021

(54) POLAR CODE ENCODING/DECODING METHOD AND ENCODING/DECODING APPARATUS

(71) Applicant: HUAWEI TECHNOLOGIES CO., LTD., Guangdong (CN)

(72) Inventors: Lingchen Huang, Hangzhou (CN); Rong Li, Hangzhou (CN); Chen Xu, Hangzhou (CN); Gongzheng Zhang, Hangzhou (CN); Shengchen Dai, Hangzhou (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 0 days.

(21) Appl. No.: 16/556,920

(22) Filed: Aug. 30, 2019

(65) Prior Publication Data

US 2020/0028524 A1    Jan. 23, 2020

Related U.S. Application Data

(63) Continuation of application No. PCT/CN2018/077853, filed on Mar. 2, 2018.

(30) Foreign Application Priority Data

Mar. 2, 2017    (CN) .......................... 201710121488.7

(51) Int. Cl.
*H03M 13/27* (2006.01)
*H03M 13/09* (2006.01)
*H03M 13/13* (2006.01)

(52) U.S. Cl.
CPC ....... *H03M 13/2792* (2013.01); *H03M 13/09* (2013.01); *H03M 13/13* (2013.01)

(58) Field of Classification Search
CPC .................................................. H03M 13/2792
(Continued)

(56) References Cited

U.S. PATENT DOCUMENTS

| 2016/0182187 A1 | 6/2016 | Kim et al. |
| 2019/0268025 A1 | 8/2019 | Shen et al. |

(Continued)

FOREIGN PATENT DOCUMENTS

| CN | 104219019 A | 12/2014 |
| CN | 106452460 A | 2/2017 |

OTHER PUBLICATIONS

Ericsson:"Design of CRC-assisted Polar Code",3GPP Draft; R1-1701630 Design of CRC-Assisted Polar Code, 3rd Generation Partnership Project (3GPP), Moblecompetence Centre ; 650, Route Des Lucioles ; F-06921 Sophia-Antipolis CEDEX; France vol. RAN WGI, No. Athens, Greece;Feb. 13, 2017-Feb. 17, 2017 Feb. 12, 2017 (Feb. 12, 2017),XP051208797, total 8 pages.

(Continued)

*Primary Examiner* — Fritz Alphonse
(74) *Attorney, Agent, or Firm* — Womble Bond Dickinson (US) LLP

(57) ABSTRACT

Embodiments of polar encoding/decoding methods and apparatuses are described. CRC encoding is performed on an information block to obtain a CRC encoded block with a length of B, where a CRC length is Lcrc, an information block length is K, and B=K+Lcrc. The CRC encoded block is interleaved. Lpc CRC bits in the interleaved encoded block are located between bits of the information block. Each CRC bit of the Lpc CRC bits is located after all bits checked by using the CRC bit. Lpc is an integer greater than 0 and less than Lcrc. The interleaved encoded block is mapped to information bits. A frozen bit is set to an agreed fixed value. Polar encoding is performed on the information (Continued)

bits and the frozen bit to obtain a polar encoded codeword to improve performance of a CA-polar code.

17 Claims, 11 Drawing Sheets

(58) Field of Classification Search
USPC .................. 714/752, 751, 754, 757, 755
See application file for complete search history.

(56) References Cited

U.S. PATENT DOCUMENTS

2020/0067525 A1* 2/2020 Jayasinghe ....... H03M 13/2906
2020/0099471 A1* 3/2020 Ye ..................... H03M 13/6356

OTHER PUBLICATIONS

Huawei et al: "Parity-Check polar and CRC-aided polar evaluation",3GPP Draft; R1-1701701, 3rd Generation Partnership Project (3GPP), Moble Competence Centre ; 650, Route Deslucioles ; F-06921 Sophia-Antipolis CEDEX; France vol. RAN WGI, No. Athens, Greece;Feb. 13, 2017-Feb. 17, 2017 Feb. 12, 2017 (Feb. 12, 2017),XP051208867,total 10 pages.
Intel Corporation: "Polar code design", 3GPP Draft; R1-1700386 PC Design Vfinal,3rd Generation Partnership Project (3GPP),Moble Competence Centre ; 650, Route Des; Lucoles ; F-06921 Sophia-Antipolis CEDEX ;France vol. RAN WGI, No. Spokane, USA; Jan. 16, 2017-Jan. 20, 2017 Jan. 16, 2017 (Jan. 16, 2017), XP051207923,total 12 pages.
Nokia et al: "Details of CRC distribution of Polar design",3GPP Draft; R1-1703497 Details of CRC Distribution of Polar Design, 3rd Generation Partnership Project (3GPP),Moble Competence Centre ; 650, Route Des Lucioles ; F-06921 Sophia-Antipolis Cedex; FRA vol. RAN WGI, No. Athens, Greece;Feb. 13, 2017-Feb. 17, 2017 Feb. 15, 2017 (Feb. 15, 2017),XP051222045,total 10 pages.
Qualcomm incorporated:"Comparison of polar codes for control channel",dated Feb. 12, 2017. total 14 pages.

* cited by examiner

1800

POLAR CODE ENCODING/DECODING METHOD AND ENCODING/DECODING APPARATUS

CROSS-REFERENCE TO RELATED APPLICATIONS

This application claims is a continuation of International Application No. PCT/CN2018/077853, filed on Mar. 2, 2018, which claims priority to Chinese Patent Application No. 201710121488.7, filed on Mar. 2, 2017. The disclosures of the aforementioned applications are hereby incorporated by reference in their entireties.

TECHNICAL FIELD

Embodiments of the invention relate to the wireless communications field, and more specifically, to a polar code encoding/decoding method and an encoding/decoding apparatus.

BACKGROUND

In a communications system, data transmission reliability is usually improved through channel coding, to ensure communication quality. Polar code proposed by the Turkish professor Arikan is the first high-performance code that has been theoretically proved to be capable of achieving a Shannon capacity and that has low encoding/decoding complexity. The polar code is a linear block code. An encoding matrix of the polar code is $G_N$, and an encoding process is $x_1^N = u_1^N G_N$, where $u_1^N = (u_1, u_2, K, u_N)$ is a binary row vector of a length N (a mother code length), $G_N$ is an N×N matrix, and $G_N = F_2^{\otimes(log_2(N))}$, $F_2^{\otimes(log_2(N))}$ is defined as a Kronecker product of $log_2 N$ matrices $F_2$. The matrix $$F_2 = \begin{bmatrix} 1 & 0 \\ 1 & 1 \end{bmatrix}.$$

In an encoding process of a conventional polar code, a part of bits in $u_1^N$ are used to carry information and are referred to as information bits, and a set of indexes of these bits is denoted as A. The other part of bits are set to fixed values that are pre-agreed on by a transmit end and a receive end and are referred to as fixed bits or frozen bits, and a set of indexes of the bits is represented by using a complementary set $A^c$ of A. The encoding process of the polar code is equivalent to $x_1^N = u_A G_N(A) \oplus u_{A^c} G_N(A^c)$. Herein, $G_N(A)$ is a sub-matrix obtained based on rows corresponding to the indexes in the set A in $G_N$, and $G_N(A^c)$ is a sub-matrix obtained based on rows corresponding to the indexes in the set $A^c$ in $G_N$. $u_A$ is an information bit set in $u_1^N$, and a quantity of information bits is K; and $u_{A^c}$ is a frozen bit set in $u_1^N$, a quantity of frozen bits is (N−K), and the frozen bits are known bits. Values of these frozen bits are usually set to 0. However, the fixed bits may be randomly set provided that the transmit end and the receive end pre-agree. When the fixed bits are set to 0, encoding output of the polar code may be simplified as: $x_1^N = u_A G_N(A)$, and $x_1^N = u_A G_N(A)$, $G_N(A)$ is a K×N matrix.

A construction process of the polar code, namely, a selection process of the set A, determines polar code performance. The construction process of the polar code is usually as follows: A total of N polarized channels respectively corresponding to N rows of the encoding matrix are determined based on a mother code length N; reliability of the polarized channels is calculated; and indexes of first K polarized channels with relatively high reliability are used as elements in the set A, and indexes corresponding to remaining (N−K) polarized channels are used as elements in the set $A^c$ of the indexes of the fixed bits. The set A determines positions of the information bits, and the set $A^c$ determines positions of the fixed bits.

At a decoding end, the polar code may be decoded in sequence from a first bit by using a successive cancellation (SC) decoding algorithm. A successive cancellation list (SCL) decoding algorithm is an improvement to the SC decoding algorithm. Based on the SCL decoding algorithm, a plurality of candidate decoding results are retained in a decoding process. In the SCL, the decoding process is considered as a path search process. To be specific, a first bit is used as a root node for extension of a path, and a metric is used to evaluate the path. The metric is dynamically updated with extension of the path according to a preset rule. For each time of extension (when a next bit is decoded), L candidate paths whose path metrics are optimal in a current layer are retained until extension is performed to a last layer (a last bit is decoded). Finally, a path whose metric is optimal in the L candidate paths is used as decoding output. Maximum likelihood decoding performance can be obtained by using the SCL decoding algorithm.

To improve performance of a polar code, a CA-polar code is proposed to improve the polar code in the prior art. The CA-polar code is a cyclic redundancy check (CRC)-concatenated polar code, and is referred to as a CA-polar code. CRC encoding is performed on an information block, and then CRC encoded bits are mapped to information bits. Correspondingly, during decoding, a CRC-aided successive cancellation list (CA-SCL) decoding algorithm is used for decoding, in other words, a candidate path that passes the CRC is selected, from the L candidate paths output in SCL decoding, as decoding output. If a correct path is deleted due to a low metric at an intermediate node of CA-SCL decoding, a subsequent CRC check cannot improve SCL decoding performance.

SUMMARY

Embodiments of this application provide a polar code encoding method, an encoding apparatus, a decoding method, and a decoding apparatus, to further improve performance of a CA-polar code.

In at least some embodiments, a polar encoding method is provided, including:

performing CRC encoding on an information block to obtain a CRC encoded block with a length of B, where a CRC length is Lcrc, an information block length is K, and B=K+Lcrc;

interleaving the CRC encoded block, where Lpc CRC bits in an interleaved encoded block are located between bits of the information block, each CRC bit of the Lpc CRC bits is located after all bits checked by using the CRC bit, and Lpc is an integer greater than 0 and less than Lcrc; and mapping the interleaved encoded block to positions of information bits, setting a frozen bit to an agreed fixed value, and performing polar encoding on the information bits and the frozen bit to obtain a polar encoded codeword, where positions of the information bits are positions corresponding to B polarized channels with optimal reliability, a position of the frozen bit is a position corresponding to one of remaining N−B polarized channels, and N is a mother code length of a polar code.

In at least some embodiments, an encoding apparatus is provided, including:

a CRC encoding unit, configured to perform CRC encoding on an information block to obtain a CRC encoded block with a length of B, where a CRC length is Lcrc, an information block length is K, and B=K+Lcrc;

an interleaving unit, configured to interleave the CRC encoded block, where Lpc CRC bits in an interleaved encoded block are located between bits of the information block, each CRC bit of the Lpc CRC bits is located after all bits checked by using the CRC bit, and Lpc is an integer greater than 0 and less than Lcrc; and a polar encoding unit, configured to: map the encoded block obtained after the interleaving is performed by the interleaving unit to positions of information bits, set a frozen bit to an agreed fixed value, and perform polar encoding on the information bits and the frozen bit to obtain a polar encoded codeword, where positions of the information bits are positions corresponding to B polarized channels with optimal reliability, a position of the frozen bit is a position corresponding to one of remaining N−B polarized channels, and N is a mother code length of a polar code.

In at least some embodiments, an encoding apparatus is provided, including:

a memory, configured to store a program; and a processor, configured to execute the program stored in the memory, where when the program is executed, the processor is configured to: perform CRC encoding on an information block to obtain a CRC encoded block with a length of B, where a CRC length is Lcrc, an information block length is K, and B=K+Lcrc; interleave the CRC encoded block, where Lpc CRC bits in an interleaved encoded block are located between bits of the information block, each CRC bit of the Lpc CRC bits is located after all bits checked by using the CRC bit, and Lpc is an integer greater than 0 and less than Lcrc; and map the interleaved encoded block to information bits, set a frozen bit to an agreed fixed value, and perform polar encoding on the information bits and the frozen bit to obtain a polar encoded codeword, where positions of the information bits are positions corresponding to B polarized channels with optimal reliability, a position of the frozen bit is a position corresponding to one of remaining N−B polarized channels, and N is a mother code length of a polar code.

In at least some embodiments, an encoding apparatus is provided, including:

at least one input end, configured to receive an information block;

a signal processor, configured to: perform CRC encoding on the information block to obtain a CRC encoded block with a length of B, where a CRC length is Lcrc, an information block length is K, and B=K+Lcrc; interleave the CRC encoded block, where Lpc CRC bits in an interleaved encoded block are located between bits of the information block, each CRC bit of the Lpc CRC bits is located after all bits checked by using the CRC bit, and Lpc is an integer greater than 0 and less than Lcrc; and map the interleaved encoded block to information bits, set a frozen bit to an agreed fixed value, and perform polar encoding on the information bits and the frozen bit to obtain a polar encoded codeword, where positions of the information bits are positions corresponding to B polarized channels with optimal reliability, a position of the frozen bit is a position corresponding to one of remaining N−B polarized channels, and N is a mother code length of a polar code; and at least one output end, configured to output the polar encoded codeword obtained by the signal processor.

In at least some embodiments, a polar decoding method is provided, including:

obtaining positions of information bits and a frozen bit in to-be-decoded bits, where the information bits include K bits of an information block and Lcrc CRC bits, Lpc CRC bits are located between bits of the information block, each CRC bit of the Lpc CRC bits is located after all bits checked by using the CRC bit, and Lpc is an integer greater than 0 and less than Lcrc;

sequentially decoding the to-be-decoded bits by using a successive cancellation list SCL decoding algorithm, and outputting L candidate paths whose metrics are optimal, where in a decoding process, a value of a frozen bit in each candidate path is set to an agreed fixed value, a value of each CRC bit of the Lpc CRC bits is determined based on a value of a bit that is of the information block, that is checked by using the CRC bit, and that is located before the CRC bit, and remaining (Lcrc−Lpc) CRC bits are decoded in a manner of decoding the information bits;

de-interleaving T candidate paths whose metrics are optimal in the L candidate paths, where T is an integer greater than 0 and less than or equal to L; and performing a CRC check on the T candidate paths, and using, as decoding output, an information block in a candidate path that passes the CRC check and whose path metric is optimal.

In at least some embodiments, a decoding apparatus is provided, including:

an obtaining unit, configured to obtain positions of information bits and a frozen bit in to-be-decoded bits, where the information bits include K bits of an information block and Lcrc CRC bits, Lpc CRC bits are located between bits of the information block, each CRC bit of the Lpc CRC bits is located after all bits checked by using the CRC bit, and Lpc is an integer greater than 0 and less than Lcrc;

a decoding unit, configured to: sequentially decode the to-be-decoded bits by using a successive cancellation list SCL decoding algorithm, and output L candidate paths whose metrics are optimal, where in a decoding process, a value of a frozen bit in each candidate path is set to an agreed fixed value, a value of each CRC bit of the Lpc CRC bits is determined based on a value of a bit that is of the information block, that is checked by using the CRC bit, and that is located before the CRC bit, and remaining (Lcrc−Lpc) CRC bits are decoded in a manner of decoding the information bits;

an interleaving unit, configured to de-interleave T candidate paths whose metrics are optimal in the L candidate paths, where T is an integer greater than 0 and less than or equal to L; and a CRC check unit, configured to: perform a CRC check on the T candidate paths, and use, as decoding output, an information block in a candidate path that passes the CRC check and whose path metric is optimal.

In at least some embodiments, a decoding apparatus is provided, including:

a memory, configured to store a program; and a processor, configured to execute the program stored in the memory, where when the program is executed, the processor is configured to: obtain positions of information bits and a frozen bit in to-be-decoded bits, where the information bits include K bits of an information block and Lcrc CRC bits, Lpc CRC bits are located between bits of the information block, each CRC bit of the Lpc CRC bits is located after all bits checked by using the CRC bit, and Lpc is an integer greater than 0 and less than Lcrc; sequentially decode the to-be-decoded bits by using a successive cancellation list SCL decoding algorithm, and output L candidate paths whose metrics are optimal, where in a decoding process, a value of a frozen bit in each candidate path is set to an agreed fixed value, a value of each CRC bit of the Lpc CRC bits is determined based on a value of a bit that is of the information block, that is checked by using the CRC bit, and that is located before the CRC bit, and remaining (Lcrc−Lpc) CRC bits are decoded in a manner of decoding the information bits; de-interleave T candidate paths whose metrics are optimal in the L candidate paths, where T is an integer greater than 0 and less than or equal to L; and perform a CRC check on the T candidate paths, and use, as decoding output, an information block in a candidate path that passes the CRC check and whose path metric is optimal.

In at least some embodiments, a decoding apparatus is provided, including:

at least one input end, configured to receive information about to-be-decoded bits;

a signal processor, configured to: obtain positions of information bits and a frozen bit in the to-be-decoded bits, where the information bits include K bits of an information block and Lcrc CRC bits, Lpc CRC bits are located between bits of the information block, each CRC bit of the Lpc CRC bits is located after all bits checked by using the CRC bit, and Lpc is an integer greater than 0 and less than Lcrc; sequentially decode the to-be-decoded bits by using a successive cancellation list SCL decoding algorithm, and output L candidate paths whose metrics are optimal, where in a decoding process, a value of a frozen bit in each candidate path is set to an agreed fixed value, a value of each CRC bit of the Lpc CRC bits is determined based on a value of a bit that is of the information block, that is checked by using the CRC bit, and that is located before the CRC bit, and remaining (Lcrc−Lpc) CRC bits are decoded in a manner of decoding the information bits; de-interleave T candidate paths whose metrics are optimal in the L candidate paths, where T is an integer greater than 0 and less than or equal to L; and perform a CRC check on the T candidate paths; and at least one output unit, configured to use, as decoding output, an information block in a candidate path that passes the CRC check and whose path metric is optimal.

In at least some embodiments, the interleaving the CRC encoded block includes: interleaving the CRC encoded block by using an interleaving sequence $\pi=[\pi 1, \pi 2, \ldots, \pi n]$, and permuting a CRC encoded bit sequence $[b1, b2, \ldots, bn]$ into $b\pi 1, b\pi 2, \ldots, b\pi n$, where n is an integer greater than 0 and less than or equal to B, and a value of an represents a bit position sequence number that is of an $n^{th}$ bit of the interleaved encoded block and that is in the encoded block before the interleaving is performed.

In at least some embodiments, Lpc, Lcrc, T, and a false alarm rate FAR upper limit that is specified in a communications system meet the following relationship:

$$L_{pc} \leq L_{crc} - \log_2 T + \log_2 FAR.$$

In at least some embodiments, Lcrc is 27, and Lpc is 8; or Lcrc is 24, and Lpc is 6; or Lcrc is 22, 23, 14 or 15, and Lpc is 4.

In at least some embodiments, the metric is a path metric PM.

In at least some embodiments, if none of the T candidate paths passes the CRC check, an information block of a path whose metric is optimal in the T candidate paths is used as decoding output, or it is determined that the decoding fails.

In at least some embodiments, the CRC encoding is one time of CRC encoding. The CRC encoded block is obtained after only the one time of CRC encoding is performed based on the length Lcrc.

In at least some embodiments, Lcrc and Lpc meet the following relationship: Lcrc−Lpc=10; or Lcrc−Lpc=18.

In at least some embodiments, Lpc=1 and Lcrc=11; Lpc=2 and Lcrc=12; Lpc=4 and Lcrc=14; Lpc=6 and Lcrc=16; or Lpc=8 and Lcrc=18.

In at least some embodiments, Lpc=1 and Lcrc=19; Lpc=2 and Lcrc=20; Lpc=4 and Lcrc=22; Lpc=6 and Lcrc=24; or Lpc=8 and Lcrc=26.

In at least some embodiments, a computer readable storage medium is provided. The computer readable storage medium stores an instruction, where when the instruction runs on a computer, the computer is enabled to perform the encoding method or the decoding method as described herein.

In at least some embodiments, a computer program product including an instruction is provided, where when the instruction runs on a computer, the computer is enabled to perform the encoding method or the decoding method as described herein.

In at least some embodiments, a computer program is provided, where when the computer program runs on a computer, the computer is enabled to perform the encoding method or the decoding method as described herein.

In at least some embodiments, after the CRC encoding, interleaving is performed on the CRC encoded block, so that a part of CRC bits in the interleaved encoded block are distributed between the bits of the information block, and each CRC bit in the part of CRC bits is located after all bits checked by using the CRC bit, in other words, each of the part of CRC bits is used to check only bits that are of the information block and are before the CRC bit. In the decoding process, the part of CRC bits are used as parity check bits for decoding. If a previous information bit is incorrectly decoded, a value of a CRC bit that is calculated based on the previous information bit is more likely to be inconsistent with a received LLR. In this case, a metric of the path is degraded, and this incorrect path is more likely to be deleted when metrics of candidate paths are sorted. Therefore, CA-SCL decoding performance is improved.

DESCRIPTION OF EMBODIMENTS

Technical solutions in the embodiments of this application may be applied to a 5G communications system or a future communications system, or may be applied to various other communications systems such as a global system for mobile communications (GSM) system, a code division multiple access (CDMA) system, a wideband code division multiple access (WCDMA) system, a general packet radio service (GPRS) system, a long term evolution (LTE) system, an LTE frequency division duplex (FDD) system, an LTE time division duplex (TDD) system, and a universal mobile telecommunications system (UMTS).

Figure 1:
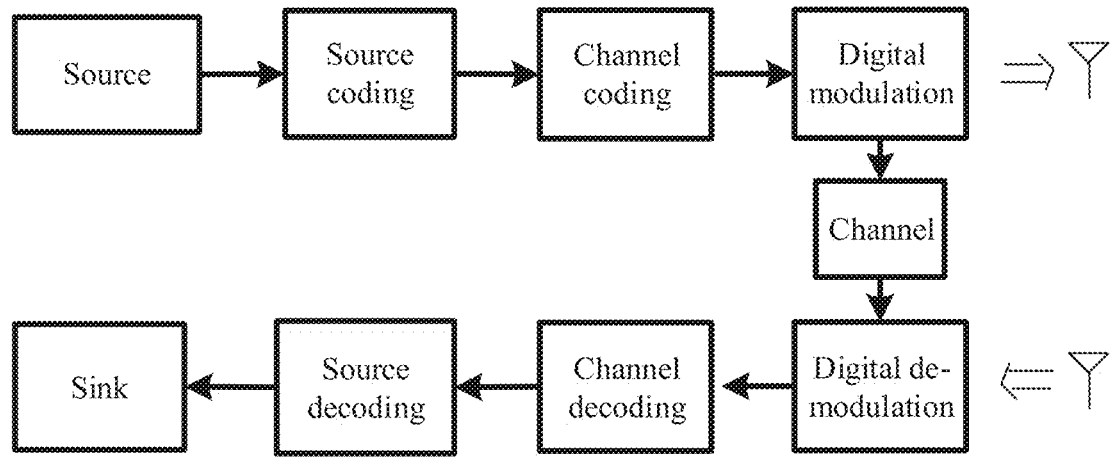
FIG. 1 is a schematic diagram of a basic procedure of wireless communication between a transmit end and a receive end.

FIG. 1 shows a basic procedure of wireless communication. At a transmit end, a source is sent after source coding, channel coding, and digital modulation are sequentially performed on the source. At a receive end, the source undergoes digital demodulation, channel decoding, and source decoding sequentially, and then a sink is output. Polar code may be used for channel coding and decoding, and SC decoding and SCL decoding may be used during channel decoding. An SCL decoding algorithm is an improvement to an SC decoding algorithm. A plurality of candidate paths are retained in a decoding process, and a path is selected as a decoding result based on a metric of each candidate path.

For a metric of an $l^{th}$ path PMl(i), that is, a path metric (PM) of the $l^{th}$ path when an $i^{th}$ bit is decoded, a calculation formula is shown as formula (1) (assuming that when an LLR>0, a value corresponding to the LLR is 0, or when an LLR<0, a value corresponding to the LLR is 1):

$$PM_l(i) = \begin{cases} PM_l(i-1), \\ PM_l(i-1) + |LLR_l(i)|, \end{cases} \quad \text{formula (1)}$$

when the value corresponding to the LLR is consistent with a decision result when the value corresponding to the LLR is inconsistent with the decision result where LLR(i) represents a log-likelihood ratio (LLR) of the current bit. The value corresponding to the LLR may be 0 or 1. For example, when the LLR<0, the value corresponding to the LLR is 1, or when the LLR<0, the value corresponding to the LLR is 0. Certainly, in actual application, another method may alternatively be used. For example, when the LLR<0, the value corresponding to the LLR is set to 0, or when the LLR>0, the value corresponding to the LLR is set to 1. When the LLR=0, the value corresponding to the LLR may be considered as 0 or 1, and may be set as required in actual application. If the value corresponding to the LLR of the current bit is consistent with the decision result, the PM remains unchanged; or if the value (0 or 1) corresponding to the LLR of the current bit is inconsistent with the decision result, a penalty value |LLR(i)| is added to the PM. The penalty value is an absolute value of the LLR of the current bit. It can be learned from the calculation formula of the PM that a smaller PM indicates that a likelihood between a codeword corresponding to the path and a received signal is relatively high and indicates that the metric of the path is more desirable. Therefore, a path whose PM is minimum may be finally output as a decoding result. In formula (1), if the value (0 or 1) corresponding to the LLR of the current bit is inconsistent with the decision result, the penalty value |LLR(i)| may alternatively be subtracted from the PM, that is, PMl(i)=PMl(i−1)−|LLR(i)|. Correspondingly, selecting a path whose metric is optimal means selecting a path whose PM is maximum. This application uses formula (1) as an example for description.

In an SCL decoding process, if the current bit is an information bit, each path is extended to two paths, and a total of 2L paths are obtained through extension, where L is a quantity of candidate paths that need to be retained finally. A decision result of each node is 0 or 1, and a PM of each path is calculated according to the foregoing formula. Then, the paths obtained through extension are sorted based on PMs, L paths whose PMs are smallest are retained, and remaining L paths are deleted. This is also referred to as pruning. If the current bit is a frozen bit, a corresponding node in each path is not extended and is directly determined as a corresponding known fixed value, and a PM of the path is calculated according to formula (1).

Figure 2A:
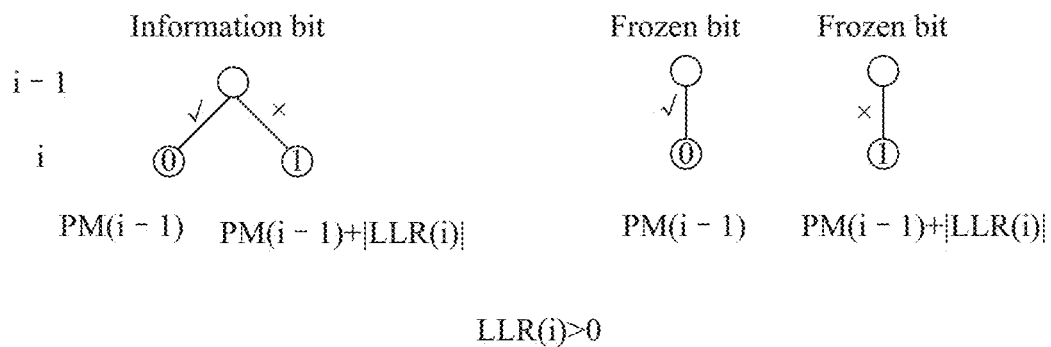
FIG. 2a is a schematic diagram of path extension and metric calculation when an LLR of a current bit is greater than 0 according to an embodiment of this application.
Figure 2B:
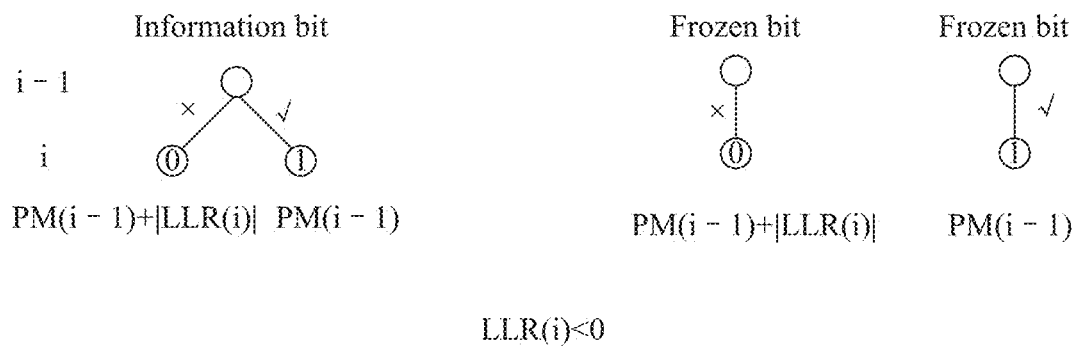
FIG. 2b is a schematic diagram of path extension and metric calculation when an LLR of a current bit is less than 0 according to an embodiment of this application.

For ease of description, an example in which when the LLR<0, the value corresponding to the LLR is 1, or when the LLR>0, the value corresponding to the LLR is 0 is used as an example for description. As shown in FIG. 2(a), if an LLR(i) of a current decoded bit is greater than 0 (a value corresponding to an LLR is 0), in a path extension process, if the current bit is an information bit, two paths need to be obtained through extension. If a decision result is also 0, the decision result is consistent with the value corresponding to the LLR (represented by "√" in FIG. 2a). In this case, PM(i)=PM(i−1). If a decision result is 1, the decision result is inconsistent with the value corresponding to the LLR (represented by "x" in FIG. 2a). In this case, PM(i)=PM(i−1)+|LLR(i)|. If the current bit is a frozen bit, a path is not extended, and a PM is calculated based on a known fixed value. If the known fixed value is 0 and the value corresponding to the LLR is also 0, the known fixed value is consistent with the value corresponding to the LLR. In this case, PM(i)=PM(i−1). If the known fixed value is 1, the known fixed value is inconsistent with the value corresponding to the LLR. In this case, PM(i)=PM(i−1)+|LLR(i)|. As shown in FIG. 2(b), if an LLR(i) of a current decoded bit is less than 0 (a value corresponding to an LLR is 1), in a path extension process, if the current bit is an information bit, two paths need to be obtained through extension. If a decision result is 0, the decision result is inconsistent with the value corresponding to the LLR. In this case, PM(i)=PM(i−1)+|LLR(i)|. If a decision result is 1, the decision result is consistent with the value corresponding to the LLR. In this case, PM(i)=PM(i−1). If the current bit is a frozen bit, a path is not extended, and a PM is calculated based on a known fixed value. If the known fixed value is 0, and the value corresponding to the LLR is also 1, the known fixed value is inconsistent with the value corresponding to the LLR, and PM(i)=PM(i−1)+|LLR(i)|. If the known fixed value is 1, the known fixed value is consistent with the value corresponding to the LLR, and PM(i)=PM(i−1).

Figure 3:
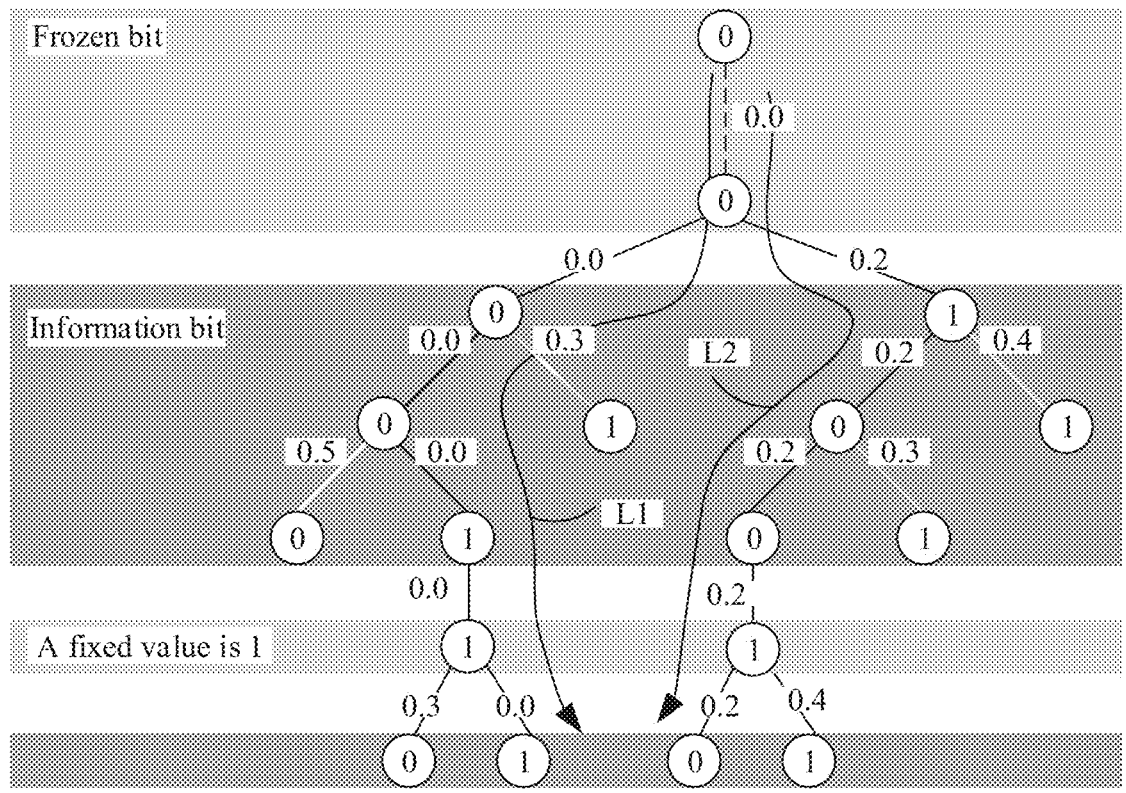
FIG. 3 is a schematic diagram of path extension and PM update in SCL decoding.

FIG. 3 shows an example, in which two candidate paths are retained in a decoding process, of an SCL decoding algorithm when List=2. Generally, the first several bits are frozen bits, and are set to fixed values, for example, 0. Therefore, decoding actually starts from a first information bit. In FIG. 3, a path whose PM is minimum is retained during each extension, and two candidate paths L1 and L2 indicated by arrows are obtained finally. A PM of the path L1 is 0.0 finally, and a PM of the other path L2 is 0.2 finally. Therefore, the path L1 whose PM is smaller, that is, 0.0, is selected as decoding output, and a value of an information bit that is obtained through decoding is 0011. A polar code and a cyclic redundancy check (CRC) code are concatenated to obtain a concatenated code, referred to as a CA-polar code. After a CRC check is performed, a path that passes the CRC is selected, as decoding output, from candidate paths output in SCL decoding. A CRC-aided successive cancellation list (CA-SCL) decoding algorithm can significantly improve performance of the polar code.

Figure 4:
FIG. 4 is a schematic diagram of a CA-polar encoding process.

A process for constructing the CA-polar code is as follows: Assuming that an information block size is Kinfo, a CRC length is Kcrc, and a mother code length of the polar code is N, Kinfo+Kcrc polarized channels with highest reliability need to be selected from N polarized channels as information bits, and a remaining polarized channel is used as a frozen bit. A CA-polar encoding process is shown in FIG. 4. First, CRC encoding is performed on an information block, and then a CRC encoded bit is mapped to a position of an information bit. A fixed value agreed on between a transmit end and a receive end is set at a position of a frozen bit. Then, polar encoding is performed to obtain a CA-polar encoded block. In an SCL decoding process, the information block and the CRC bit are both unknown, and decoding is performed based on a normal SCL decoding process. After the SCL decoding ends, L candidate decoding results are obtained, and the decoding results include the information block and the CRC bit. A CRC check is performed on each candidate result starting from a path whose PM is minimum. If the path passes the CRC check, an information block on the path is used as decoding output. If no path passes the CRC check, an information block on the path whose PM is minimum is used as decoding output, or a decoding failure is indicated directly.

Figure 5:
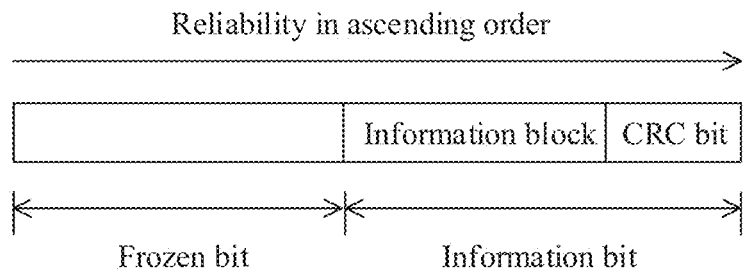
FIG. 5 is a schematic diagram of CA-polar construction.

As shown in FIG. 5, in a CA-polar encoding/decoding process, all CRC bits are used as information bits for processing, and the CRC bits are used to provide aid for selecting a path when SCL decoding ends. However, on an intermediate node in the SCL, a correct path may be deleted because a PM is relatively large.

In the embodiments of this application, in the CA-polar encoding/decoding process, a part of CRC bits are moved to positions between bits of an information block through interleaving, and values of the part of CRC bits are determined based on values of bits of an information block located before the CRC bits, in other words, a parity check is performed, by using the CRC bits, on information bits located before the CRC bits, so as to provide aid for SCL decoding of the CA-polar code. This increases a probability of deleting an incorrect path on the intermediate node, and improves performance of the CA-polar code. The part of CRC bits may also be referred to as parity check (PC) bits or special CRC bits. In any case, these special CRC bits meet the following conditions: The special CRC bits are located between bits of an information block in an encoded sequence (interleaving sequence), and are used to check only the bits of the information block located before the special CRC bits. Check equations of the special CRC bits are determined through CRC encoding, that is, the special CRC bits are used to check which bits are determined in a CRC encoding process. Bits checked by using a special CRC bit do not change after the interleaving, but only positions of the to-be-checked bits change, so that all bits checked by using the special CRC bit are located before the special CRC bit. In this way, when the special CRC bit is decoded during the decoding, a value of the special CRC bit is directly determined based on the bits checked by using the special CRC bit and located before the special CRC bit. Because different parameters such as an information block length, a CRC length, and a CRC generator polynomial are sent each time, a position of the special CRC bit changes and is not always a fixed position. A different quantity of special CRC bits may alternatively be set according to an actual requirement. For ease of description, these bits are collectively referred to as special CRC bits as follows.

Figure 6:
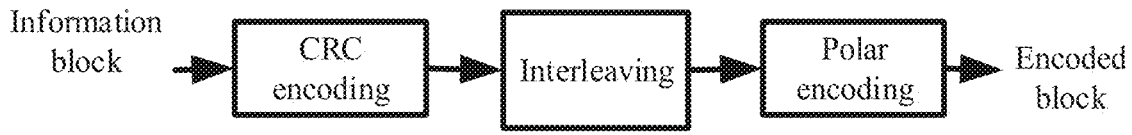
FIG. 6 is a schematic diagram of an encoding process according to an embodiment of this application.

As shown in FIG. 6, an encoding process includes the following operations:

(1) CRC encoding: CRC encoding is performed on an information block to obtain a CRC encoded block.

(2) Interleaving: Interleaving is performed on the CRC encoded block. A successive SCL decoding algorithm is used. If a part of CRC bits are used as PC bits for checking, these CRC bits are related to only to-be-decoded bits located before the CRC bits. Through the interleaving, it can be ensured that a part of information bits that are distributed between bits of the information block and that are checked by using a CRC bit are located before the CRC bit.

(3) Polar encoding: An interleaved encoded block is mapped to positions of information bits (positions of bits corresponding to polarized channels with relatively high reliability). A position of a frozen bit is corresponding to a remaining polarized channel, and the frozen bit is set to an agreed fixed value, for example, 0 or 1. Polar encoding is performed on the information bits and the frozen bit to obtain a polar encoded codeword.

When decoding is performed at a receive end, the SCL decoding algorithm is used for the decoding, path extension is performed on the information bits, and a decision is made based on a path metric. However, path extension is not required for a special CRC bit that is distributed between information blocks and that is located after all information bits checked by using the special CRC bit, and a value of the special CRC bit is determined based on the information bits that are obtained through the decoding and that are located before the special CRC bit. Path extension is not performed on the frozen bit. The frozen bit is directly decoded as a fixed value. After SCL decoding ends, L candidate paths are obtained, de-interleaving is performed on a part or all of the L candidate paths to obtain the information block and the CRC bits, a CRC check is performed on each path, and a path that passes the CRC check and whose PM is optimal is selected, as decoding output, from the candidate paths. During decoding, the CRC bit may be used to select a decoding result from the candidate paths, and may also be used for an error check, that is, to determine whether the decoding result is correct or not. During the decoding, the special CRC bit may be used as a PC bit for decoding, so as to provide aid for the SCL decoding. This increases a probability of deleting an incorrect path. The error check may alternatively be performed during the decoding. Once it is found that none of paths obtained through extension can pass the check performed by using the CRC bit, subsequent decoding is stopped, that is, the decoding is terminated, and it is determined that the decoding fails.

Because the value of the special CRC bit is determined by values of the information bits that are obtained through the decoding and that are located before the special CRC bit, once the information bits that are obtained through the decoding and that are located before the special CRC bit are incorrect, when the special CRC bit is decoded, a possibility that a value of the special CRC bit that is obtained through calculation based on the information bits is inconsistent with a received value corresponding to an LLR increases. Correspondingly, when a PM of the path is calculated, an absolute value of the LLR of the special CRC bit is added to the PM through calculation according to formula (1). This increases the PM of the path, so that a possibility of deleting the path in a subsequent decoding process increases.

Figure 7:
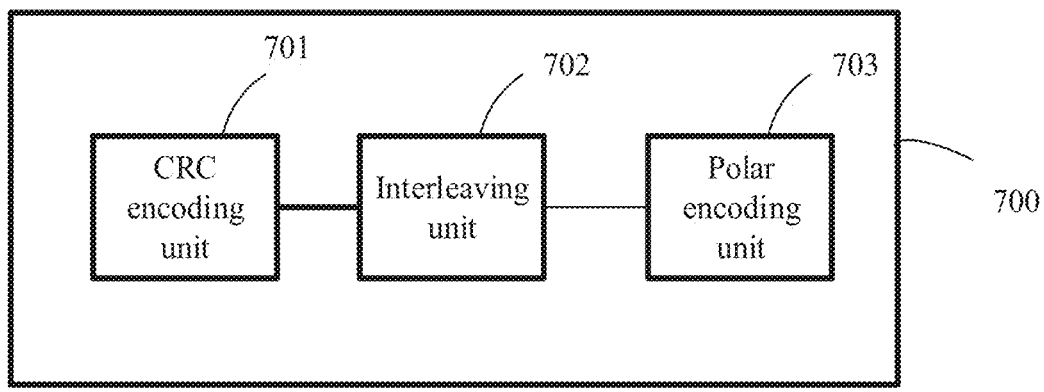
FIG. 7 is a schematic structural diagram of an encoding apparatus according to an embodiment of this application.
Figure 8:
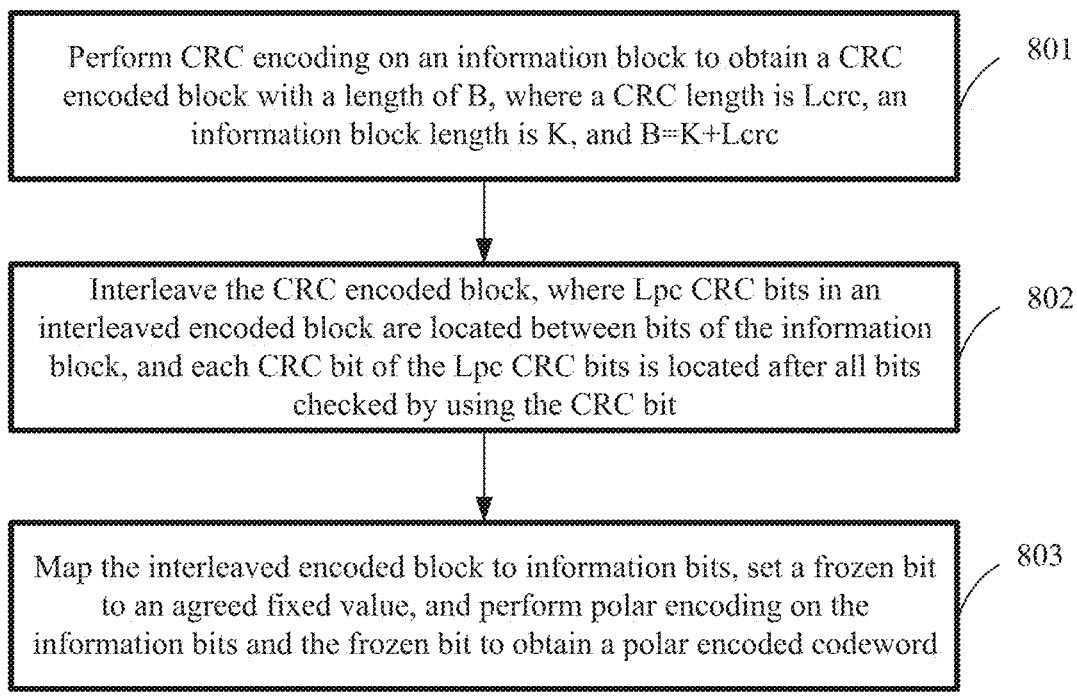
FIG. 8 is a schematic flowchart of an encoding method according to an embodiment of this application.

An encoding apparatus 700 shown in FIG. 7 may perform an encoding method shown in FIG. 7. The encoding apparatus 700 includes a CRC encoding unit 701, an interleaving unit 702, and a polar encoding unit 703. As shown in FIG. 8, the encoding method in the embodiment of this application may include the following operations.

801: Perform cyclic redundancy check CRC encoding on an information block to obtain a CRC encoded block with a length of B, where a CRC length is Lcrc, an information block length is K, and B=K+Lcrc.

The CRC encoding unit 701 is configured to perform CRC encoding on a to-be-sent information block to obtain K+Lcrc CRC encoded bits. A CRC generator polynomial is $[C_0, C_1, \ldots, C_{n-K}]$, where K is an information block length, n=K+Lcrc, and an original generator matrix of the CRC encoding is a K*n matrix:

$$G_{CRC} = \begin{bmatrix} c_0 & c_1 & \cdots & \cdots & \cdots & \cdots & \cdots & c_{n-k} & 0 & \cdots & \cdots & \cdots & \cdots & 0 \\ 0 & c_0 & c_1 & \cdots & \cdots & \cdots & \cdots & \cdots & c_{n-k} & 0 & \cdots & \cdots & \cdots & 0 \\ & & & \vdots & & & & & & & & \vdots & & \\ 0 & \cdots & \cdots & \cdots & \cdots & 0 & c_0 & c_1 & \cdots & \cdots & \cdots & \cdots & \cdots & c_{n-k} \end{bmatrix}.$$

By using a Gaussian elimination method, the foregoing generator matrix is simplified as: G=[I P], where I is a K*K unit matrix, and P is a K*Lcrc matrix. The matrix G is the K*n matrix. A row number of each row may be understood as a sequence number of a bit of a corresponding information block, a column number of each column may be understood as a sequence number of a corresponding bit output after the CRC encoding, and a value of each CRC encoded bit is a sum of values of bits corresponding to all rows whose values are 1 in the column. In this case, each column of the matrix P is corresponding to a CRC bit, and bits corresponding to row numbers to which values 1 in the column are corresponding are used as bits of the information block that are checked by using the CRC bit. Lcrc=4 and K=12 are used as an example. The matrix G=[I P] is generated through calculation based on a generator polynomial [1 0 0 1 1] of CRC-4, as shown in Table 1.

Herein, the CRC encoding is performed once on the information block.

TABLE 1

CRC generator matrix with a CRC length of 4 when K = 12

| | b1 | b2 | b3 | b4 | b5 | b6 | b7 | b8 | b9 | b10 | b11 | b12 | b13 | b14 | b15 | b16 |
|---|---|---|---|---|---|---|---|---|---|---|---|---|---|---|---|---|
| a1 | 1 | 0 | 0 | 0 | 0 | 0 | 0 | 0 | 0 | 0 | 0 | 0 | 0 | 0 | 0 | 1 |
| a2 | 0 | 1 | 0 | 0 | 0 | 0 | 0 | 0 | 0 | 0 | 0 | 0 | 1 | 0 | 0 | 1 |
| a3 | 0 | 0 | 1 | 0 | 0 | 0 | 0 | 0 | 0 | 0 | 0 | 0 | 1 | 1 | 0 | 1 |
| a4 | 0 | 0 | 0 | 1 | 0 | 0 | 0 | 0 | 0 | 0 | 0 | 0 | 1 | 1 | 1 | 1 |
| a5 | 0 | 0 | 0 | 0 | 1 | 0 | 0 | 0 | 0 | 0 | 0 | 0 | 1 | 1 | 1 | 0 |
| a6 | 0 | 0 | 0 | 0 | 0 | 1 | 0 | 0 | 0 | 0 | 0 | 0 | 0 | 1 | 1 | 1 |
| a7 | 0 | 0 | 0 | 0 | 0 | 0 | 1 | 0 | 0 | 0 | 0 | 0 | 1 | 0 | 1 | 0 |
| a8 | 0 | 0 | 0 | 0 | 0 | 0 | 0 | 1 | 0 | 0 | 0 | 0 | 0 | 1 | 0 | 1 |
| a9 | 0 | 0 | 0 | 0 | 0 | 0 | 0 | 0 | 1 | 0 | 0 | 0 | 1 | 0 | 1 | 1 |
| a10 | 0 | 0 | 0 | 0 | 0 | 0 | 0 | 0 | 0 | 1 | 0 | 0 | 1 | 1 | 0 | 0 |
| a11 | 0 | 0 | 0 | 0 | 0 | 0 | 0 | 0 | 0 | 0 | 1 | 0 | 0 | 1 | 1 | 0 |
| a12 | 0 | 0 | 0 | 0 | 0 | 0 | 0 | 0 | 0 | 0 | 0 | 1 | 0 | 0 | 1 | 1 |

A sequence [a1, a2, . . . , a12] represents an information block, and [b1, b2, . . . , b16] represents a CRC encoded block, where b13, b14, b15, and b16 are CRC bits. It can be learned from the table that bits of the information block to which values 1 in a column corresponding to b13 are corresponding are a2, a3, a4, a5, a7, a9, and a10, and corresponding CRC encoded bits are b2, b3, b4, b5, b7, b9, and b10. Therefore, b13=b2+b3+b4+b5+b7+b9+b10, a check equation is: b2+b3+b4+b5+b7+b9+b1+b13=0, and a sequence [2, 3, 4, 5, 7, 9, 10, 13] may be used to represent the check equation. Similarly, for b14, b15, and b16, check equations based on Table 1 may be respectively represented as: [3, 4, 5, 7, 9, 10, 11, 14], [4, 5, 6, 7, 9, 11, 12] and [1, 2, 3, 4, 6, 8, 9, 12].

Different CRC lengths are corresponding to different CRC generator polynomials. A same CRC length may be corresponding to a plurality of different polynomials. The following lists several CRC lengths and corresponding generator polynomials.

It is assumed that the length Lcrc is 14, and corresponding CRC generator polynomials include:
[100111110011111]
[101000101010011]
[110111111011111]
[100000000101011]
[111010101110111]
[110100100101111]
[100111011010011]
[101010010011111]
[100011001000101]
[100011000111101]
[110011101010111]
[100000000000111]
[110111111111111]
[100100000000101]
[110111001010111]
[101111111110111]
[100001111010001]
[101000111011101]
[101010110011101]
[111110111011111]
[100001001011011]
[100011011100011]
[101110111111011]

It is assumed that the length Lcrc is 15, and corresponding CRC generator polynomials include:
[1001111001000111]
[1011111111111111]
[1001111010100011]
[1011011010101111]
[1001011111110011]
[1001010001111001]
[1010100110101101]
[1000000000000011]
[1011010010001111]
[1000011000001101]
[1010111111001111]
[1110111101111111]
[1100111101001011]
[1100011000010111]
[1000000000101001]
[1011100110111101]
[1001001011101101]
[1001101011001011]
[1011011110101011]
[1101010100011011]
[1010111001110101]
[1100010110011001]
[1001000010111001]
[1110100000010101]

It is assumed that the length Lcrc is 18, and corresponding CRC generator polynomials include:
[1000111001011110011]
[1000000000000100111]
[1000111000101111101]
[1011010000100111111]
[1000011011101010111]
[1010111101110101101]
[1011101110010010011]
[1001101010001111111]
[1010000111101110011]
[1000000000000110001]
[1001011111010100111]
[1011100111110111101]
[1001111011101111001]
[1100101100011010011]
[1110010101010100111]
[1001011111011010101]

It is assumed that the length Lcrc is 19, and corresponding CRC generator polynomials include:
[11011111011010101111]
[10010000000100111111]
[10000001001101110101]
[11011010001001100111]
[10001011111000111001]
[11101010111001111111]
[10011110110101000101]
[10000000000000100111]
[10010111010110011001]
[11101111011000011111]
[10000000000000101001]
[10100011101011110011]
[10001001111011101011]
[10101101000010110101]
[10100000101010010011]
[11101111001110001111]

It is assumed that the length Lcrc is 22, and corresponding CRC generator polynomials include:
[11000010001111110100111]
[11011011100100000000001]
[10100010100110101010101001]
[11100100010101111010011]
[10011100101001101101011]
[11101111000011000101101]
[11111011111000101100011]
[10010111101110111111011]
[11011011100000100110001]
[11100010110000110100101]
[10000000000000000000011]
[10101011101101110100111]
[11011011110110001001111]
[10010010000111100101001]
[10000000000000010001111]
[11100101011011010100111]
[10101010010101001010101]
[10110111001110100100011]
[10100010011100111111101]
[10010001111011110001001]
[10001011101111101101111]

It is assumed that the length Lcrc is 23, and corresponding CRC generator polynomials include:
[101010000001101111100001]
[100101101011000010110001]
[101101100111100101001001]
[110011100110001011100011]
[100011010110001101010111]
[100001010010111101100001]
[100001001001111001110111]
[101111001111011001000111]
[100000000000000000100001]
[100000000000001010101001]
[100000000000000000110111]
[100100110101101010100101]
[101001110111110110111101]
[100101101111001110100011]
[110101111000001011101011]
[101111000100100000110011]
[100011010011101011111001]
[100011000110110111101111]

It is assumed that the length Lcrc is 26, and corresponding CRC generator polynomials include:
[110011110000011001111011111]
[111010011001101110010011111]
[100111111010110111101100111]
[101001000010100010111110101]
[110110010010101010110010111]
[111011011000010100011001111]
[111110100110010001001010111]
[101001010011110111100111101]
[101110100000001111101001111]
[101101100000111011100111111]
[111010010010111110010011111]
[100000000000000000001000111]
[110000011011111110011101011]
[100111100010110100100101011]
[100000000000000000000010011]
[100011101110110110000100101]
[110001000111101001101011011]
[100101000111110110011010111]
[100001100001101100001100001]
[101100010001010100010001101]
[101011110110001001001110111]
[100100100011010011101111101]
[101011111110111101100011111]
[110010110111101111011010011]

It is assumed that the length Lcrc is 27, and corresponding CRC generator polynomials include:
[101111000000010001100011010111]
[100010000101001011010000110011]
[100000000000000000000000100111]
[110100110000110001100010011111]
[111010001011110100010111111111]
[100000000000000000000000100011]
[110101001100001000110111111111]
[101000110101111111100110101]
[110010110111101010100100111]
[101100001101001010111100111]
[110110000111111111000011011]
[100110010110110010110001111]
[101001000011111011001010111]
[100001001011000110000111111]
[100011101001111111101010001111]

802: Interleave the CRC encoded block, where Lpc CRC bits in an interleaved encoded block are located between bits of the information block, and each CRC bit of the Lpc CRC bits is located after all bits checked by using the CRC bit.

Figure 9:
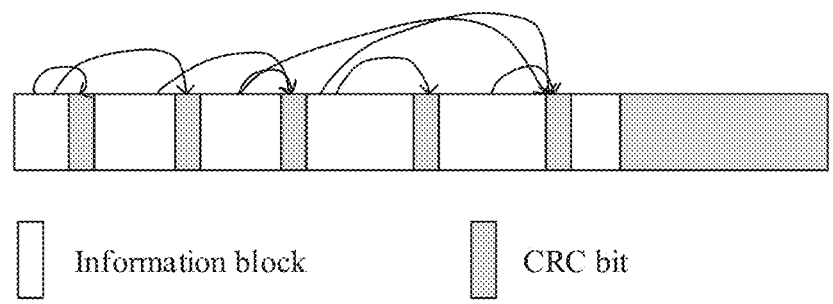
FIG. 9 is a schematic diagram of a check relationship between each special CRC bit and information bits before the special CRC bit according to an embodiment of this application.

The interleaving unit 702 is configured to interleave the CRC encoded block. An interleaving result is that the Lpc CRC bits are located between the bits of the information block, each CRC bit of the Lpc CRC bits is located after all the bits checked by using the CRC bit, and Lpc is an integer greater than 0 and less than Lcrc. That the interleaving unit 702 may be configured to interleave the CRC encoded block includes: interleaving the CRC encoded block by using an interleaving sequence $\pi=[\pi_1, \pi_2, \ldots, \pi_n]$, and permuting a CRC encoded bit sequence [b1, b2, . . . , bn] into $b\pi_1$, $b\pi_2, \ldots, b\pi_n$, where n is an integer greater than 0 and less than or equal to B, and a value of $\pi n$ represents a bit position sequence number that is of an $n^{th}$ bit of the interleaved encoded block and that is in the encoded block before the interleaving is performed. As shown in FIG. 9, after the interleaving, a part of CRC bits are distributed between the bits of the information block, and each CRC bit of the part of CRC bits is used to check bits of the information block that are located before the CRC bit, as shown by arrows in FIG. 9.

A quantity Lpc of a part of special CRC bits may be set to any integer greater than 0 and less than Lcrc. For example, if Lcrc=27, a value of Lpc may be any value ranging from 1 to 26, for example, may be 8. For example, if a value of Lcrc is 22, 23, 14, or 15, a value of Lpc is 4. It may alternatively be specified that if Lcrc is within a specific range, the value of Lpc is fixed. For example, if Lcrc is less than or equal to 23, the value of Lpc is always set to 4.

If a false alarm rate (FAR) is considered, the value of Lpc is related to the CRC length Lcrc, a quantity T of paths on which CRC-aided decoding is performed after SCL decoding, and a requirement for the false alarm rate (FAR). The false alarm rate indicates a probability of occurrence of an event that a decoding result is incorrect but a CRC check succeeds. For example, the value of Lpc may be selected with reference to the following formula (2):

$$L_{pc} \leq L_{crc} - \log_2 T + \log_2 FAR \quad (2)$$

In formula (2), Lpc is a part of the CRC length, Lcrc is the entire CRC length, and T is a pre-agreed quantity of candidate paths that need to pass the CRC check for selecting a decoding result during the decoding. If there are L candidate paths, T is an integer greater than 0 and less than or equal to L.

In a communications system, a false alarm rate upper limit may be specified. For example, it is assumed that a false alarm rate required by a downlink control channel in 5G NR is less than or equal to $2^{-16}$ (blind detection is not considered), and if a quantity T of paths on which CRC-aided decoding is performed after SCL decoding is performed on a polar code is 4, and the CRC length Lcrc is 24, a quantity of CRC bits that can be used for a parity check is Lpc≤(24−2−16)=6. It is assumed that a false alarm rate required by an uplink control channel is less than or equal to $2^{-8}$, and if a quantity T of paths on which CRC-aided decoding is performed after SCL decoding is performed on a polar code is 8, and the CRC length is Lcrc24, a quantity of CRC bits that can be used for a parity check is Lpc≤24−3−8=13.

In an implementation, fixed values of Lcrc and Lpc may be calculated by using $L_{pc}=L_{crc}-\log_2 T+\log_2 FAR$, that is, Lcrc−Lpc=log$_2$T−log$_2$FAR. For example, if FAR=$2^{-16}$ and T=4, Lcrc−Lpc=18; if FAR=$2^{-8}$ and T=4, Lcrc−Lpc=10; if FAR=$2^{-16}$ and T=8, Lcrc−Lpc=19; or if FAR=$2^{-8}$ and T=8, Lcrc−Lpc=11. Certainly, a value of (Lcrc−Lpc) varies with values of T and FAR. Different combinations may alternatively be set based on the value of (Lcrc−Lpc) and be stored at an encoding end and a decoding end. For example, when Lcrc−Lpc=10, Lpc and Lcrc may be: Lpc=1 and Lcrc=11; Lpc=2 and Lcrc=12; Lpc=4 and Lcrc=14; Lpc=6 and Lcrc=16; or Lpc=8 and Lcrc=18. When Lcrc−Lpc=18, Lpc and Lcrc may be: Lpc=1 and Lcrc=19; Lpc=2 and Lcrc=20; Lpc=4 and Lcrc=22; Lpc=6 and Lcrc=24; or Lpc=8 and Lcrc=26.

A CRC encoded bit is usually located at a last position of an encoded block. As shown in Table 1, b13, b14, b15, and b16 are located after b1, b2, . . . , and b12. At the decoding end, a CRC check is performed after decoding of all information blocks and CRC bits is completed. To enable a part of CRC bits checked before the decoding ends, positions of bits of an information block and the CRC bits may be changed through interleaving, so that the part of CRC bits are located between information bits, and bits of a to-be-checked information block are also located before the CRC bits.

The interleaving may be performed on the CRC encoded block [b1, b2, . . . , bn] by using the interleaving sequence $\pi=[\pi_1, \pi_2, \ldots, \pi_n]$, where a value of each element in it is a sequence number of the CRC encoded block, and represents an interleaved encoded block $C=[C_1, C_2, \ldots, C_n]=[b\pi_1, b\pi_2, \ldots, b\pi_n]$. Table 1 is used as an example. The interleaving sequence may be: $\pi=[2, 3, 4, 5, 7, 9, 10, 13, 8, 6, 11, 14, 12, 1, 15, 16]$, and represents an interleaving sequence $C=[C_1, C_2, \ldots, C_{12}]=[b2, b3, b4, b5, b7, b9, b10, \underline{b13}, b8, b6, b11, \underline{b14}, b12, b1, \underline{b15}, \underline{b16}]$, where underlined bits are CRC bits, and a correspondence between bits before and after the interleaving is shown in Table 2. It can be learned that a CRC bit b13 is moved to a position of C8 after the interleaving, and b2, b3, b4, b5, b7, b9, and b10 before C8 are all bits checked by using b13, and are corresponding to C1, C2, C3, C4, C5, C6, and C7 respectively. b14 is moved to a position of C12 after the interleaving, and b3, b4, b5, b7, b9, b10, and b11 are all bits checked by using b14, and are respectively corresponding to interleaved $C_2, C_3, C_4, C_5, C_6, C_7, C_9, C_{10}$, and $C_{11}$ that are also located before b14. Positions of b15 and b16 are not changed, but positions of bits checked by using b15 and b16 are changed. Bits b4, b5, b6, b7, b9, b11, and b12 checked by using b15 are corresponding to interleaved $C_3, C_4, C_{10}, C_5, C_6, C_{11}$, and $C_{13}$. Bits b1, b2, b3, b4, b6, b8, b9, and b12 checked by using b16 are corresponding to interleaved $C_{14}, C_1, C_2, C_3, C_{10}, C_9, C_6$, and $C_{13}$. For the sequence number of the interleaved encoded block, check equations are updated to:

$C_1+C_2+C_3+C_4+C_5+C_6+C_7+C_8=0$ $C_2+C_3+C_4+C_5+C_6+C_7+C_9+C_{10}+C_{11}+C_{12}=0;$ $C_3+C_4+C_{10}+C_5+C_6+C_{11}+C_{13}+C_{15}=0;$ and $C_{14}+C_1+C_2+C_3+C_{10}+C_9+C_6+C_{13}+C_{16}=0.$ Check equations represented by sequences are as follows: [1, 2, 3, 4, 5, 6, 7, 8]; [2, 3, 4, 5, 6, 7, 9, 10, 11, 12]; [3, 4, 10, 5, 6, 11, 13, 15]; and [14, 1, 2, 3, 10, 9, 6, 13, 16].

or may be moved to any other positions in an interleaving process. For example, an interleaving sequence $\pi=[2, 3, 15, 4, 5, 16, 7, 9, 10, 8, 13, 6, 11, 14, 12, 1]$ may be used. A difference from an interleaving mode shown in Table 3 lies in that, b13 is moved to a position after b8, and b15 and b16 are also distributed between the bits of the information block.

TABLE 3

| b2 | b3 | b15 | b4 | b5 | b16 | b7 | b9 | b10 | b8 | b13 | b6 | b11 | b14 | b12 | b1 |
|---|---|---|---|---|---|---|---|---|---|---|---|---|---|---|---|
| $C_1$ | $C_2$ | $C_3$ | $C_4$ | $C_5$ | $C_6$ | $C_7$ | $C_8$ | $C_9$ | $C_{10}$ | $C_{11}$ | $C_{12}$ | $C_{13}$ | $C_{14}$ | $C_{15}$ | $C_{16}$ |

803: Map the interleaved encoded block to information bits, set a frozen bit to an agreed fixed value, and perform polar encoding on the information bits and the frozen bit to obtain a polar encoded codeword.

The polar encoding unit 703 is configured to: map the interleaved encoded block to the information bits, set the frozen bit to the agreed fixed value, and perform Arikan polar encoding on the information bits and the frozen bit to obtain the polar encoded codeword. The codeword obtained through the encoding may also be referred to as an encoded block, an encoded sequence, or the like. Positions of the information bits are corresponding to first B polarized channels of polarized channels of the polar code that are sorted based on reliability in descending order, a bit corresponding to one of remaining (N–B) polarized channels is used as a frozen bit and is set to an agreed fixed value, and N is a mother code length of the polar code.

Figure 10:
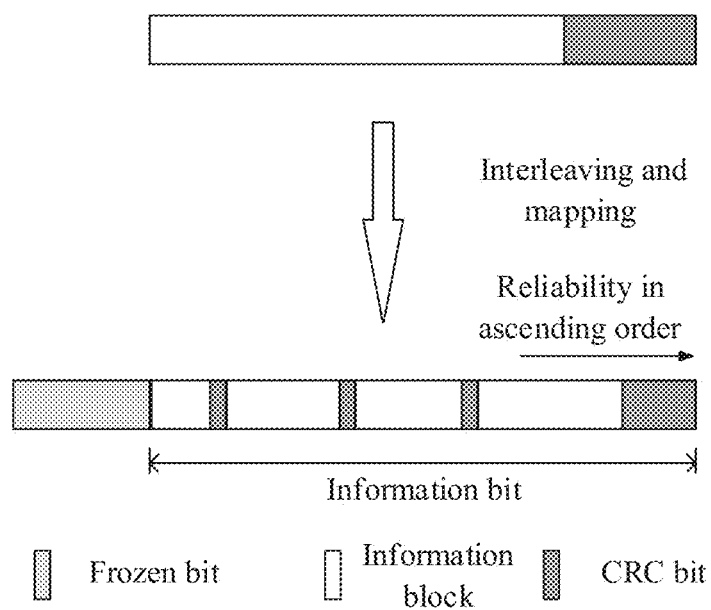
FIG. 10 is a schematic diagram of CA-polar construction according to an embodiment of this application.

As shown in FIG. 10, the polar code, the information block, and the CRC bits constructed in this embodiment of this application are distributed on a most reliable polarized channel together, and the frozen bit is distributed on a polarized channel whose reliability is lower than that of the information bits. After the interleaved encoded block is mapped to the positions of the information bits corresponding to the polarized channels, the CRC bits are distributed between the bits of the information block. During decoding, a part of CRC bits are used as parity check bits. This can improve a probability of deleting an incorrect path during CA-SCL decoding. In addition, a remaining CRC bit can still be used for a CRC check. Because a check equation of a special CRC bit is determined in a CRC check process, the check equation does not need to be separately set.

TABLE 2

| b2 | b3 | b4 | b5 | b7 | b9 | b10 | b13 | b8 | b6 | b11 | b14 | b12 | b1 | b15 | b16 |
|---|---|---|---|---|---|---|---|---|---|---|---|---|---|---|---|
| $C_1$ | $C_2$ | $C_3$ | $C_4$ | $C_5$ | $C_6$ | $C_7$ | $C_8$ | $C_9$ | $C_{10}$ | $C_{11}$ | $C_{12}$ | $C_{13}$ | $C_{14}$ | $C_{15}$ | $C_{16}$ |

In an example in Table 2, b13 is moved to a position that is after all bits checked by using b13 and that is as close as possible to the front. This is not limited thereto. For example, b13 may alternatively be moved to a position that is close to the back, for example, moved to a position after b8. Similarly, b14 may be moved to a position after b12. b13 and b14 are referred to as special CRC bits. After the interleaving, the special CRC bits are distributed between bits of the information block, and all bits of information blocks checked by using the special CRC bits are located before the special CRC bits. Remaining CRC bits b15 and b16 may not be used as special CRC bits, and be used as normal CRC bits for a CRC check. The CRC check is performed after the decoding ends and is used for selecting a candidate path. The two CRC bits are located at the end, In operation 802, the interleaving sequence may be preset after calculation, or may be calculated in a real-time manner in an encoding process. There are a plurality of methods for determining the interleaving sequence. The following provides some examples.

The interleaving sequence it is calculated based on a CRC generator matrix, the CRC length Lcrc, the information bit length K, and the quantity Lpc of the special CRC bits, and a process may include the following operations.

(1) Elementary row permutation is performed on the CRC generator matrix G=[I P] to obtain G=[I' P'].

(a) Through the row permutation, first p1 rows in a first column of P' are 1, and all subsequent elements are 0. A $(p_1+1)^{th}$ row to a $(p_1+p_2)^{th}$ row in a second column are 1, and all subsequent elements are 0. By analogy, a $(p_1+p_2 \ldots +p_{n-1}+1)^{th}$ row in a $(n-1)^{th}$ column is 1, and all subsequent elements are 0.

(b) An initial interleaving sequence $\pi_0$ is obtained based on column sequence numbers corresponding to elements 1 in each row of I'.

finally, as shown in Table 4. Based on a square matrix I' on the left of G', column sequence numbers corresponding to elements 1 are read row by row to obtain the initial interleaving sequence $\pi_0$=[2, 3, 4, 5, 7, 9, 10, 8, 6, 11, 12, 1], where $\pi_0$ indicates initial interleaving performed on the information block.

TABLE 4

|     | b1 | b2 | b3 | b4 | b5 | b6 | b7 | b8 | b9 | b10 | b11 | b12 | b13 | b14 | b15 | b16 |
|-----|----|----|----|----|----|----|----|----|----|-----|-----|-----|-----|-----|-----|-----|
| a2  | 0  | 1  | 0  | 0  | 0  | 0  | 0  | 0  | 0  | 0   | 0   | 0   | 1   | 0   | 0   | 1   |
| a3  | 0  | 0  | 1  | 0  | 0  | 0  | 0  | 0  | 0  | 0   | 0   | 0   | 1   | 1   | 0   | 1   |
| a4  | 0  | 0  | 0  | 1  | 0  | 0  | 0  | 0  | 0  | 0   | 0   | 0   | 1   | 1   | 1   | 1   |
| a5  | 0  | 0  | 0  | 0  | 1  | 0  | 0  | 0  | 0  | 0   | 0   | 0   | 1   | 1   | 1   | 0   |
| a7  | 0  | 0  | 0  | 0  | 0  | 0  | 1  | 0  | 0  | 0   | 0   | 0   | 1   | 0   | 1   | 0   |
| a9  | 0  | 0  | 0  | 0  | 0  | 0  | 0  | 0  | 1  | 0   | 0   | 0   | 1   | 0   | 1   | 1   |
| a10 | 0  | 0  | 0  | 0  | 0  | 0  | 0  | 0  | 0  | 1   | 0   | 0   | 1   | 1   | 0   | 0   |
| a8  | 0  | 0  | 0  | 0  | 0  | 0  | 0  | 1  | 0  | 0   | 0   | 0   | 0   | 1   | 0   | 1   |
| a6  | 0  | 0  | 0  | 0  | 0  | 1  | 0  | 0  | 0  | 0   | 0   | 0   | 0   | 1   | 1   | 1   |
| a11 | 0  | 0  | 0  | 0  | 0  | 0  | 0  | 0  | 0  | 0   | 1   | 0   | 0   | 1   | 1   | 0   |
| a12 | 0  | 0  | 0  | 0  | 0  | 0  | 0  | 0  | 0  | 0   | 0   | 1   | 0   | 0   | 1   | 1   |
| a1  | 1  | 0  | 0  | 0  | 0  | 0  | 0  | 0  | 0  | 0   | 0   | 0   | 0   | 0   | 0   | 1   |

(2) Lpc rows are inserted into P' to obtain P'''. The special CRC bits corresponding to Lpc columns in P' are selected, and then P' is processed for columns corresponding to all the CRC bits column by column in the following manner:

(a) If an $i^{th}$ column is corresponding to a special CRC bit, a row is inserted below a row in which a last element 1 in the $i^{th}$ column is located, and an inserted row number is recorded. An $i^{th}$ element in the inserted row is 1, and remaining elements are 0.

(b) If an $i^{th}$ column is corresponding to a common CRC bit, a row is inserted below any row, and an inserted row number is recorded. An $i^{th}$ element in the inserted row is 1, and remaining elements are 0.

(3) P''' is read. For the Lpc columns corresponding to the special CRC bits in P''', a set of row sequence numbers to which elements 1 are corresponding is read column by column. For the $i^{th}$ column, a read set represents a check equation $PCF_i$.

(4) Based on the row number of the inserted row recorded in operation (2), a sequence $\pi_p$=[K+1, K+2, ..., K+Lcrc] is sequentially inserted into the initial interleaving sequence $\pi_0$ to obtain a final interleaving sequence $\pi=[\pi_1, \pi_2, \ldots, \pi_n]$, and a final check equation is obtained.

It should be noted that an operation process for the matrix P in operations (1) and (2) is not unique, provided that a last element 1 in each column of the Lpc columns corresponding to the special CRC bits is located in the row inserted in operation (2).

The following uses CRC-4 as an example to describe a generation process of the interleaving sequence.

(1) The matrix G=[I P] is generated through calculation based on a generator polynomial [1 0 0 1 1] of CRC-4 when K=12, as shown in Table 1. Row permutation is performed on the generator matrix G A second row, a third row, a fourth row, a fifth row, a seventh row, a ninth row, and a tenth row are permuted to a first row, the second row, the third row, the fourth row, the fifth row, a sixth row, and the seventh row based on row numbers corresponding to elements 1 in a thirteenth column; an eleventh row is permuted to the tenth row based on row numbers corresponding to elements 1 in a fourteenth column; a twelfth row is permuted to the eleventh row based on row numbers corresponding to elements 1 in a fifteenth column; and G=[I' P'] is obtained (2) A row is inserted into P' to obtain P'''. An element 1 in the inserted row may be adjacent to a last element 1 in the column in p', or may be separated from a last element 1 in the column in P' with several rows. The inserted row represents a position of an interleaved CRC bit. For example, a row is inserted above each of an eighth row, a twelfth row, a fourteenth row, and a sixteenth row of the matrix P' sequentially, and an inserted row number sequence are [8, 12, 14, 16], as shown in Table 5.

(3) CRC bits [13, 14, 15, 16] are inserted into the initial interleaving sequence at positions of [8, 12, 14, 16], to obtain a final interleaving sequence $\pi$=[2, 3, 4, 5, 7, 9, 10, 13, 8, 6, 11, 14, 12, 15, 1, 16]. Check equations of the four CRC bits may be represented in sequence as follows: [1, 2, 3, 4, 5, 6, 7, 8], [2, 3, 4, 7, 9, 10, 11, 12], [3, 4, 5, 6, 10, 11, 13, 14], and [1, 2, 3, 6, 9, 10, 13, 15, 16].

Positions of the inserted rows are not limited. The bits of the information block that meet the check may be located before the special CRC bits and as close as possible to the front, and insertion positions of common CRC bits may be random. For example, a row may be inserted above each of a ninth row, a thirteenth row, the fourteenth row, and the sixteenth row of the matrix P' sequentially, and an inserted row number sequence is [9, 13, 14, 16], as shown in Table 6. The CRC bits [13, 14, 15, 16] are inserted into the initial interleaving sequence at positions of [9, 13, 14, 16], to obtain a final interleaving sequence $\pi$=[2, 3, 4, 5, 7, 9, 10, 8, 13, 6, 11, 12, 14, 15, 1, 16]. Check equations of the four CRC bits may be represented in sequence as follows: [1, 2, 3, 4, 5, 6, 7, 9], [2, 3, 4, 7, 8, 10, 11, 13], [3, 4, 5, 6, 10, 11, 13, 14], and [1, 2, 3, 6, 9, 10, 13, 15, 16].

TABLE 5

|    | 1 | 2 | 3 | 4 |
|----|---|---|---|---|
| 1  | 1 | 0 | 0 | 1 |
| 2  | 1 | 1 | 0 | 1 |
| 3  | 1 | 1 | 1 | 1 |
| 4  | 1 | 1 | 1 | 0 |
| 5  | 1 | 0 | 1 | 0 |
| 6  | 1 | 0 | 1 | 1 |
| 7  | 1 | 1 | 0 | 0 |
| 8  | 1 | 0 | 0 | 0 |
| 9  | 0 | 1 | 0 | 1 |
| 10 | 0 | 1 | 1 | 1 |

TABLE 5-continued

|    | 1 | 2 | 3 | 4 |
|----|---|---|---|---|
| 11 | 0 | 1 | 1 | 0 |
| 12 | 0 | 1 | 0 | 0 |
| 13 | 0 | 0 | 1 | 1 |
| 14 | 0 | 0 | 1 | 0 |
| 15 | 0 | 0 | 0 | 1 |
| 16 | 0 | 0 | 0 | 1 |

TABLE 6

|    | 1 | 2 | 3 | 4 |
|----|---|---|---|---|
| 1  | 1 | 0 | 0 | 1 |
| 2  | 1 | 1 | 0 | 1 |
| 3  | 1 | 1 | 1 | 1 |
| 4  | 1 | 1 | 1 | 0 |
| 5  | 1 | 0 | 1 | 0 |
| 6  | 1 | 0 | 1 | 1 |
| 7  | 1 | 1 | 0 | 0 |
| 8  | 0 | 1 | 0 | 1 |
| 9  | 1 | 0 | 0 | 0 |
| 10 | 0 | 1 | 1 | 1 |
| 11 | 0 | 1 | 1 | 0 |
| 12 | 0 | 0 | 1 | 1 |
| 13 | 0 | 1 | 0 | 0 |
| 14 | 0 | 0 | 1 | 0 |
| 15 | 0 | 0 | 0 | 1 |
| 16 | 0 | 0 | 0 | 1 |

Figure 11:
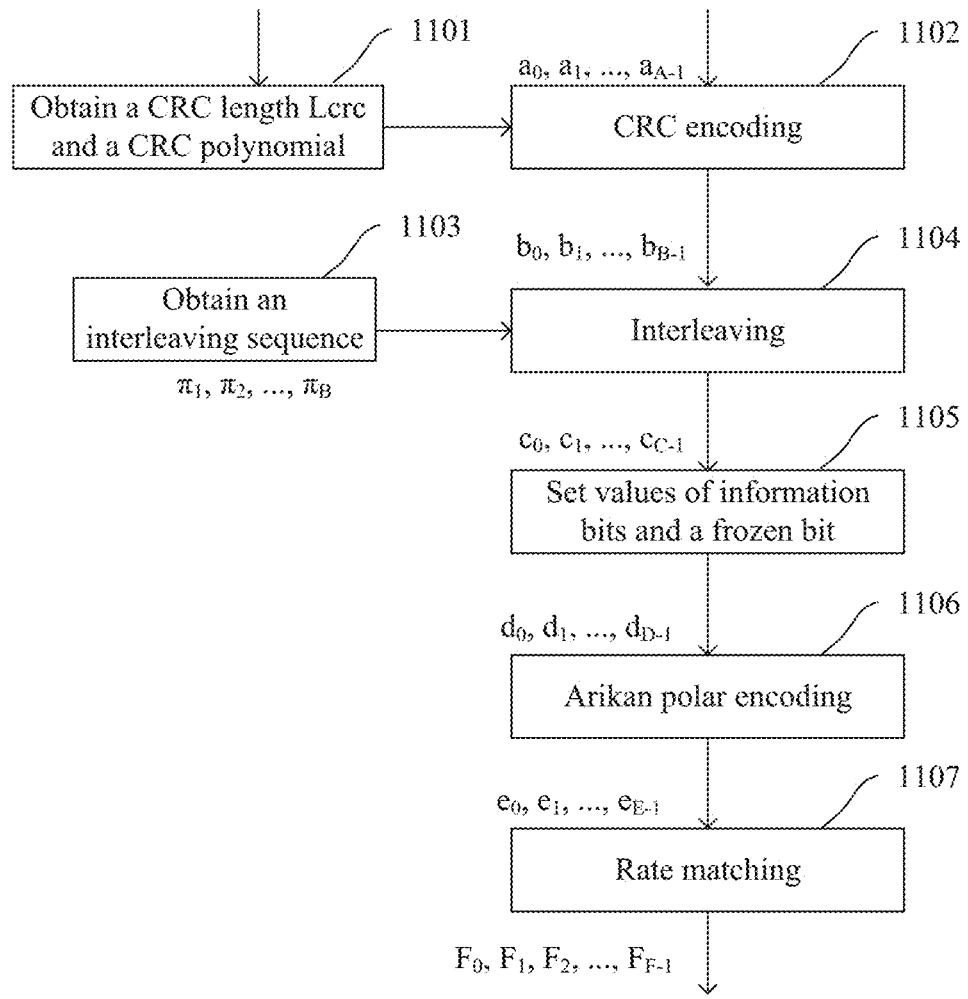
FIG. 11 is a flowchart of another encoding method according to an embodiment of this application.

FIG. 11 is a schematic flowchart of another encoding method according to an embodiment of this application. The method may be performed by the encoding apparatus shown in FIG. 7 or an encoding apparatus shown in FIG. 12 or FIG. 13. The method includes the following operations.

1101: Obtain a CRC length Lcrc and a CRC polynomial. This operation may be performed by an obtaining unit 701 in FIG. 7, a processor 1202 in FIG. 12, or a signal processor 1302 in FIG. 13. The CRC length Lcrc may be preconfigured at a transmit end and a receive end in a communications system.

1102: Perform CRC encoding on an information block. This operation may be performed by the CRC encoding unit 701 in FIG. 7, the processor 1202 in FIG. 12, or the signal processor 1302 in FIG. 13.

It is assumed that A=K, B=K+Lcrc, a sequence input in the CRC encoding is $a_0, a_1, a_2, \ldots, a_{A-1}$, check bits generated after the CRC encoding are $p_0, p_1, \ldots, p_{Lcrc-1}$, and a sequence output after the CRC encoding is $b_1, b_2, \ldots, b_{B-1}$. The sequence obtained through the CRC encoding meets formula (3).

$$\begin{cases} b_k = a_k, & \text{for } k = 0, 1, 2, \ldots, A-1 \\ b_k = p_{k-A}, & \text{for } k = A, A+1, A+2, \ldots, B-1 \end{cases} \quad \text{formula (3)}$$

1103: Obtain an interleaving sequence $\pi=[\pi_1, \pi_2, \ldots, \pi_B]$, where the interleaving sequence may be preset, or may be obtained through calculation based on a CRC generator matrix, an information block length, and the CRC length Lcrc. Through interleaving, Lpc CRC bits may be located between bits of the information block, and to-be-checked information bits are located before the CRC bit. Lpc may be a quantity less than Lcrc, or may be selected based on a range determined by formula (2). Lpc is selected according to a preset rule, and may be configured at the transmit end and the receive end in the communications system.

1104: Interleave, based on the interleaving sequence, the sequence $b_1, b_2, \ldots, b_{B-1}$ output after the CRC encoding to obtain an interleaving sequence $C_0, C_1, \ldots, C_{C-1}$, where C=B. Values of the sequence $C_0, C_1, C_2, \ldots, C_{C-1}$ are corresponding to $b\pi_1, b\pi_2, \ldots, b\pi_B$.

1105: Set values of the information bits and a frozen bit to obtain $d_0, d_1, d_2, \ldots, d_{D-1}$, where D=N, and N is a mother code length of a polar code. This operation may be performed by the polar encoding unit 703 in FIG. 7, the processor 1202 in FIG. 12, or the signal processor 1302 in FIG. 13. The set values of the information bits and the frozen bit are obtained based on formula (4).

$$\begin{cases} d_i = c_j, & i \in \text{a set of information bits or} \\ & \text{a set of CRC bits} \\ d_i = 0, & i \in \text{a set of frozen bits} \end{cases} \quad \text{formula (4)}$$

1106: Perform Arikan polar encoding to output an encoded sequence $e_0, e_1, e_2, \ldots, e_{E-1}$, where E=N. A calculation process in the polar encoding may be represented by using the following formula (5). This operation may be performed by the polar encoding unit 703 in FIG. 7.

$$[e_0, e_1, e_2, \ldots, e_{E-1}] = [d_0, d_1, d_2, \ldots, d_{D-1}] \cdot F_2^{\otimes n},$$
where $n = \log_2 N$ \hfill formula (5)

Optionally, the method may further include operation 1105: Perform rate matching on the encoded sequence, and output an encoded sequence $F_0, F_1, F_2, \ldots, F_{F-1}$ after the rate matching, where F=M, and M is a target code length. If the target code length M is different from the mother code length N, the rate matching is performed on the encoded sequence obtained in operation 1105, for example, the rate matching is performed by using a repetition, shortening, or puncturing method. When the mother code length N is less than the target code length M, (M−N) bits may be repeated in the encoded sequence to obtain an encoded sequence of the target code length M. If the mother code length N is greater than the target code length M, (N−M) bits may be punctured or shortened to obtain an encoded sequence of the target code length M, where a puncturing or shortening solution may be preset. Operation 1105 may be performed by a rate matching unit (not shown in the figure) in the encoding apparatus in FIG. 7, the processor 1202 in FIG. 12, or the signal processor 1302 in FIG. 13.

Figure 12:
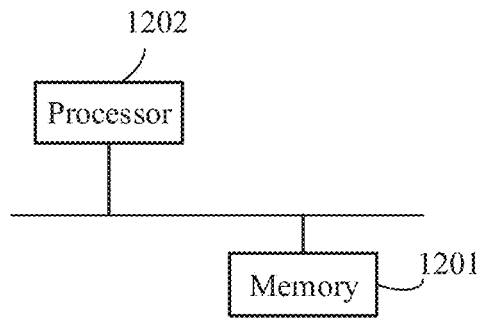
FIG. 12 is a schematic structural diagram of another encoding apparatus according to an embodiment of this application.

As shown in FIG. 12, this application provides another encoding apparatus 1200 that may implement the encoding method in this application. The encoding apparatus 1200 includes a memory 1201 and a processor 1202.

The memory 1201 is configured to store a program.

The processor 1202 is configured to: execute the program stored in the memory, and when the program is executed, perform the encoding method shown in FIG. 8. For example, the method includes: performing CRC encoding on an information block to obtain a CRC encoded block with a length of B, where a CRC length is Lcrc, an information block length is K, and B=K+Lcrc; interleaving the CRC encoded block, where Lpc CRC bits in an interleaved encoded block are located between bits of the information block, each CRC bit of the Lpc CRC bits is located after all bits checked by using the CRC bit, and Lpc is an integer greater than 0 and less than Lcrc; and mapping the interleaved encoded block to information bits, setting a frozen bit to an agreed fixed value, and performing polar encoding on the information bits and the frozen bit to obtain a polar encoded codeword, where positions of the information bits are positions corresponding to B polarized channels with optimal reliability, a position of the frozen bit is a position corresponding to one of remaining N−B polarized channels, and N is a mother code length of a polar code.

For content such as a quantity Lpc of special CRC bits, an interleaving sequence, and a generation method, reference may be made to the foregoing encoding method. The memory 1201 may be a physically independent unit, or may be integrated into the processor 1202. For other content related to the encoding method, reference may be made to FIG. 8 and related parts in the embodiment corresponding to FIG. 8, and details are not described herein.

The encoding apparatus in FIG. 12 may further include a transmitter (not shown in the figure), configured to send an encoded block obtained after the polar encoding is performed on the information bits and the frozen bit by the processor 1202.

Figure 13:
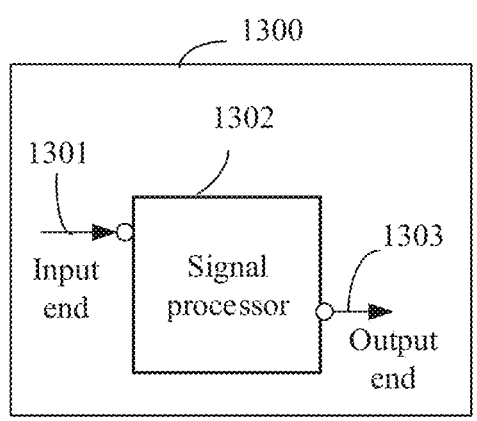
FIG. 13 is a schematic structural diagram of still another encoding apparatus according to an embodiment of this application.

As shown in FIG. 13, this application provides still another encoding apparatus 1300 that may implement the encoding method in this application. The encoding apparatus 1300 includes at least one input end 1301, a signal processor 1302, and at least one output end 1303.

The at least one input end 1301 is configured to receive an information block.

The signal processor 1302 is configured to: perform CRC encoding on the information block to obtain a CRC encoded block with a length of B, where a CRC length is Lcrc, an information block length is K, and B=K+Lcrc; interleave the CRC encoded block, where Lpc CRC bits in an interleaved encoded block are located between bits of the information block, each CRC bit of the Lpc CRC bits is located after all bits checked by using the CRC bit, and Lpc is an integer greater than 0 and less than Lcrc; and map the interleaved encoded block to information bits, set a frozen bit to an agreed fixed value, and perform polar encoding on the information bits and the frozen bit to obtain a polar encoded codeword, where positions of the information bits are positions corresponding to B polarized channels with optimal reliability, a position of the frozen bit is a position corresponding to one of remaining N−B polarized channels, and N is a mother code length of a polar code.

The at least one output end 1303 is configured to output the encoded block obtained by the signal processor 1302.

For content such as a quantity Lpc of special CRC bits, an interleaving sequence, and a generation method, reference may be made to the foregoing encoding method. Optionally, the signal processor 1302 may be implemented by using hardware, for example, a baseband processor, a processing circuit, an encoder, or an encoding circuit. For other content related to the encoding method, reference may be made to FIG. 8 and related parts in the embodiment corresponding to FIG. 8, and details are not described herein.

The encoding apparatus in FIG. 12 may further include a transmitter (not shown in the figure), configured to send the encoded block output by the output end 1303.

The encoding apparatus in this application may be any device with a wireless communications function, for example, an access point, a station, user equipment, or a base station.

Figure 14:
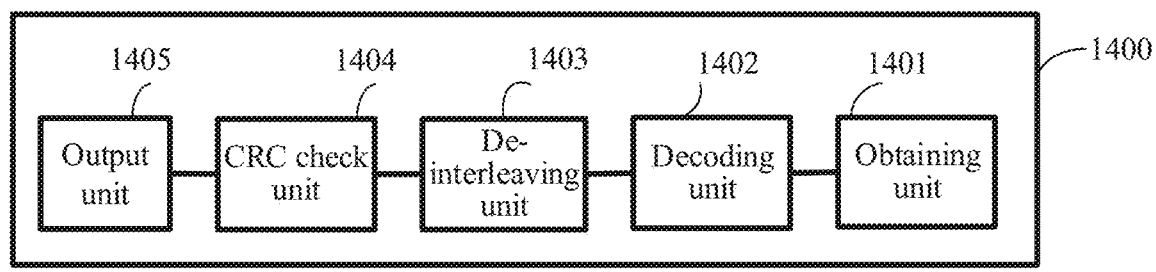
FIG. 14 is a schematic structural diagram of a decoding apparatus according to an embodiment of this application.
Figure 15:
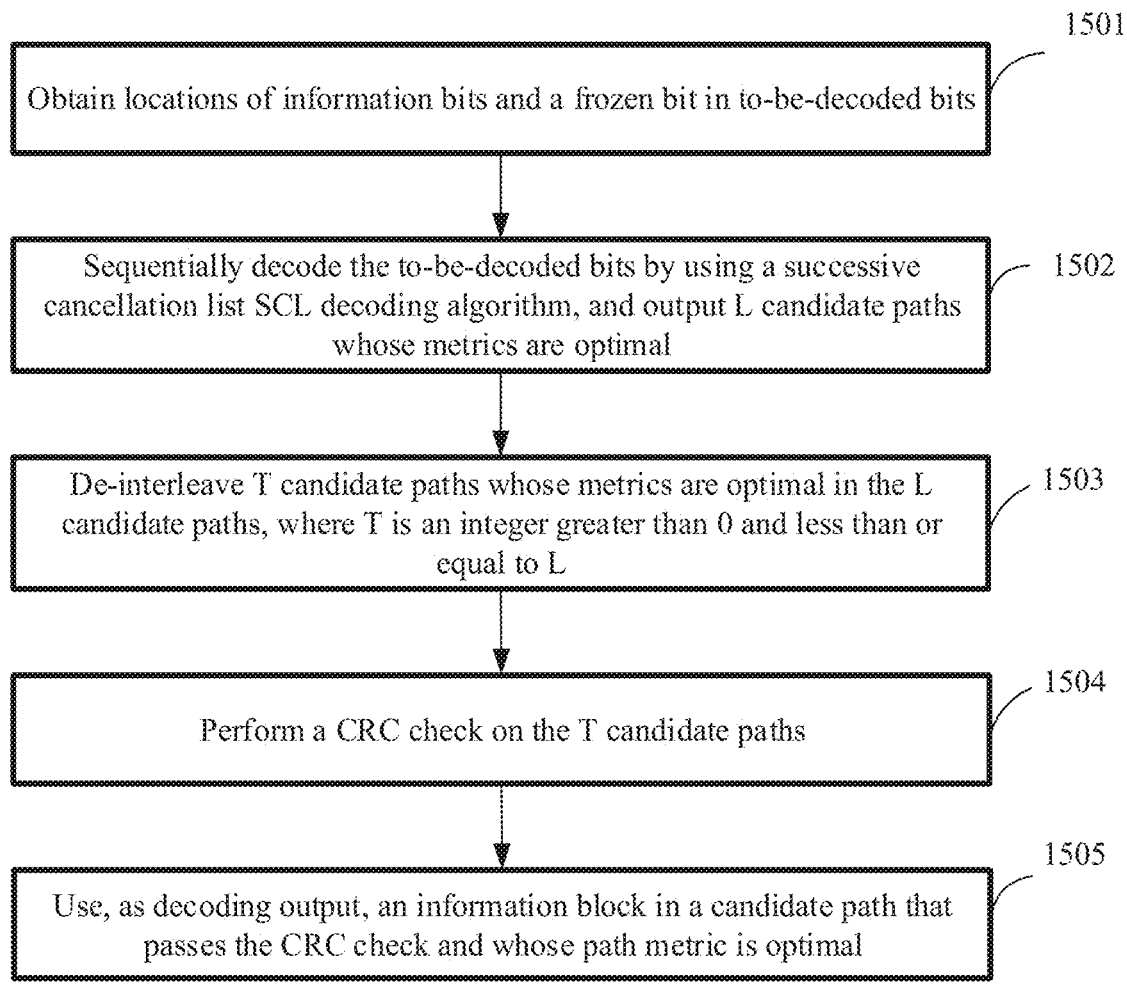
FIG. 15 is a schematic flowchart of a decoding method according to an embodiment of this application.

A decoding apparatus 1400 shown in FIG. 14 may be configured to perform a decoding method in this application. As shown in FIG. 15, a decoding process includes the following operations.

1501: Obtain positions of information bits and a frozen bit in to-be-decoded bits.

An obtaining unit 1401 is configured to obtain the positions of the information bits and the frozen bit in the to-be-decoded bits, where the information bits include K bits of an information block and Lcrc CRC bits, Lpc CRC bits are located between bits of the information block, and each CRC bit of the Lpc CRC bits is located after all bits checked by using the CRC bit. The obtaining unit 1401 may obtain the positions of the information bits and the frozen bit based on a sorting sequence of reliability of polarized channels, where reliability of polarized channels corresponding to the information bits is higher than reliability of a polarized channel corresponding to the frozen bit. Specifically, based on the sorting sequence of reliability of polarized channels, the obtaining unit 1401 selects K+Lcrc most reliable polarized channels as information bits, and uses remaining polarized channels as frozen bits, where K is a size of the information block, and Lcrc is a quantity of CRC bits.

1502: Sequentially decode the to-be-decoded bits by using a successive cancellation list SCL decoding algorithm, and output L candidate paths whose metrics are optimal.

A decoding unit 1402 is configured to: sequentially decode the to-be-decoded bits by using the successive cancellation list SCL decoding algorithm, and output the L candidate paths whose metrics are optimal, where in a decoding process, a value of a frozen bit in each candidate path is set to an agreed fixed value, a value of each CRC bit of the Lpc CRC bits is determined based on a value of a bit that is of the information block, that is checked by using the CRC bit, and that is located before the CRC bit, and remaining (Lcrc−Lpc) CRC bits are decoded in a manner of decoding the information bits.

In an SCL decoding process, a CRC bit is used as an information bit for decoding and is an unknown bit, and path extension needs to be performed in the decoding process. At an encoding end, values of a part of CRC bits are determined, through interleaving, by only information bits that are located before the CRC bits. Therefore, if the part of the CRC bits are used as parity check bits, the CRC bits are decoded in a manner of decoding the frozen bit, and are used as known bits for decoding, and path extension is not performed in the decoding process, but decoding results of the part of CRC bits are determined by using check equations and decoded information bits located before the part of CRC bits. Path extension does not need to be performed on the frozen bit, provided that the corresponding bit is directly set to a fixed value in the decoding process. For a specific decoding process, reference may be made to FIG. 2 and FIG. 3 and corresponding descriptions of FIG. 2 and FIG. 3.

1503: De-interleave T candidate paths whose metrics are optimal in the L candidate paths, where T is an integer greater than 0 and less than or equal to L.

A de-interleaving unit 1403 is configured to perform the de-interleaving on the T candidate paths whose metrics are optimal in the L candidate paths, where T is an integer greater than 0 and less than or equal to L. To be specific, the de-interleaving unit 1403 may perform the de-interleaving on all the L candidate paths (when T=L), or may select a part of paths for the de-interleaving (when T<L). If Lrc, Lpc, and a false alarm rate upper limit are given, a value of T may be determined by referring to formula (2).

1504: Perform a CRC check on the T candidate paths.

A CRC check unit 1404 may sequentially perform the CRC check on the T candidate paths starting from a candidate path whose metric is optimal. The CRC check unit 1404 may perform the CRC check on each of the T candidate paths to obtain a result: the check succeeds or the check fails. Alternatively, after a first candidate path that passes the CRC check is obtained, remaining candidate paths are no longer checked.

1505: Use, as decoding output, an information block in a candidate path that passes the CRC check and whose path metric is optimal.

An output unit 1405 is configured to select, as output of this time of decoding, the information block corresponding to the information bit in the candidate path that passes the CRC check and whose path metric is optimal. If the CRC check unit 1404 starts the CRC check from the candidate path whose metric is optimal, the first candidate path that passes the CRC check may be directly used as a decoding result, and an information block in the first candidate path is output.

Operation 1501 may further include: obtaining a check equation. The check equation may be determined by using a CRC polynomial and an interleaving sequence. Information bits checked by using each CRC bit depend on a generator matrix determined by the CRC polynomial, and the interleaving sequence may determine positions, after interleaving, of information bits checked by using each CRC bit, so that an interleaved check equation is obtained.

Figure 16:
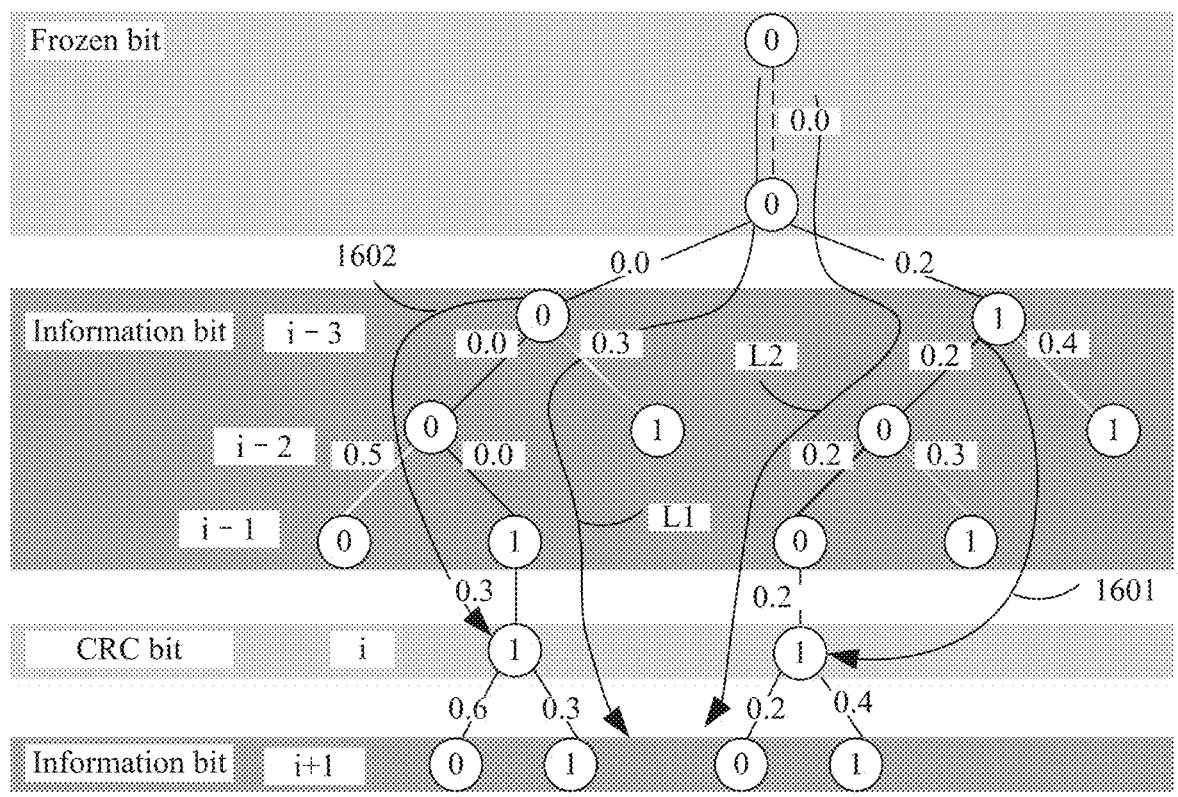
FIG. 16 is a schematic diagram of path extension and path metric update in SCL decoding according to an embodiment of this application.

FIG. 16 shows an example, in which two candidate paths are retained in a decoding process, of an SCL decoding algorithm when List=2. Generally, the first several bits are frozen bits, and are set to fixed values, for example, 0 or 1. Therefore, decoding actually starts from a first information bit. In FIG. 16, a PM is calculated by using formula (1). A path whose PM is minimum is retained during each extension, and two candidate paths L1 and L2 indicated by arrows are obtained finally. A PM of the path L1 is 0.3 finally, and a PM of the other path L2 is 0.2 finally. A CRC check is first performed on the path L2 whose PM is minimum (a metric is optimal). If the path L2 passes the check, L2 is selected as decoding output. If the path L2 does not pass the check, the check is performed on the path L1. If the path L1 passes the check, L1 is selected as decoding output. If neither L1 nor L2 passes the check, the path L2 whose PM is smaller (whose metric is optimal) may be selected as a decoding result for outputting. If neither L1 nor L2 passes the check, it may alternatively be determined that this time of decoding fails. In the decoding process, a value of List may be different, for example, List=8, 16, 32, or 64.

$i^{th}$ bits marked in FIG. 16 are a part of CRC bits (special CRC bits) described in this application. Two arrows 1601 indicate that a value of the special CRC bit is determined by a $(i-3)^{th}$ bit (information bit). It can be learned that when an $i^{th}$ bit is decoded, path extension does not need to be performed, and a value of the $i^{th}$ bit is determined by a value of the $(i-3)^{th}$ bit in the path. Therefore, a value of a special CRC bit in the path L1 is 0, and a value of a special CRC bit in L2 is 1. A difference between FIG. 16 and FIG. 3 lies in that the $i^{th}$ bit is corresponding to a frozen bit in FIG. 3, and the $i^{th}$ bit is corresponding to a special CRC bit in FIG. 15. When the special CRC bit is decoded, the PM in FIG. 16 changes relative to the PM in FIG. 3. Specifically, in FIG. 16, it is assumed that an LLR(i) of the special CRC bit in the path L1 and an LLR(i) of the special CRC bit in the path L2 are less than 0, and it is assumed that a corresponding value is 1 when the LLR(i) is less than 0. In the path L1, a decoding result 0 of the $i^{th}$ bit is inconsistent with a result corresponding to the LLR(i), and based on formula (1), an |LLR(i)| is added to the PM, assuming that |LLR(i)| is 0.3. In the path L2, a decoding result 1 of the $i^{th}$ bit is consistent with the value corresponding to the LLR(i), and based on formula (1), PM(i)=PM(i−1)=0.2. If decoding performed on a previous bit in L1 is incorrect, the special CRC bit i is determined based on a result obtained through the decoding performed on the previous bit in L1, and may also be incorrect. This increases a probability that the decoding result of the $i^{th}$ bit is inconsistent with the value corresponding to the LLR(i), and a penalty value |LLR(i)| is added to the PM(i). In this case, the PM of the path increases, and a probability that the incorrect path is deleted during decoding increases. In this embodiment, a smaller PM indicates a better path, and a larger PM indicates a worse path.

Figure 17A:
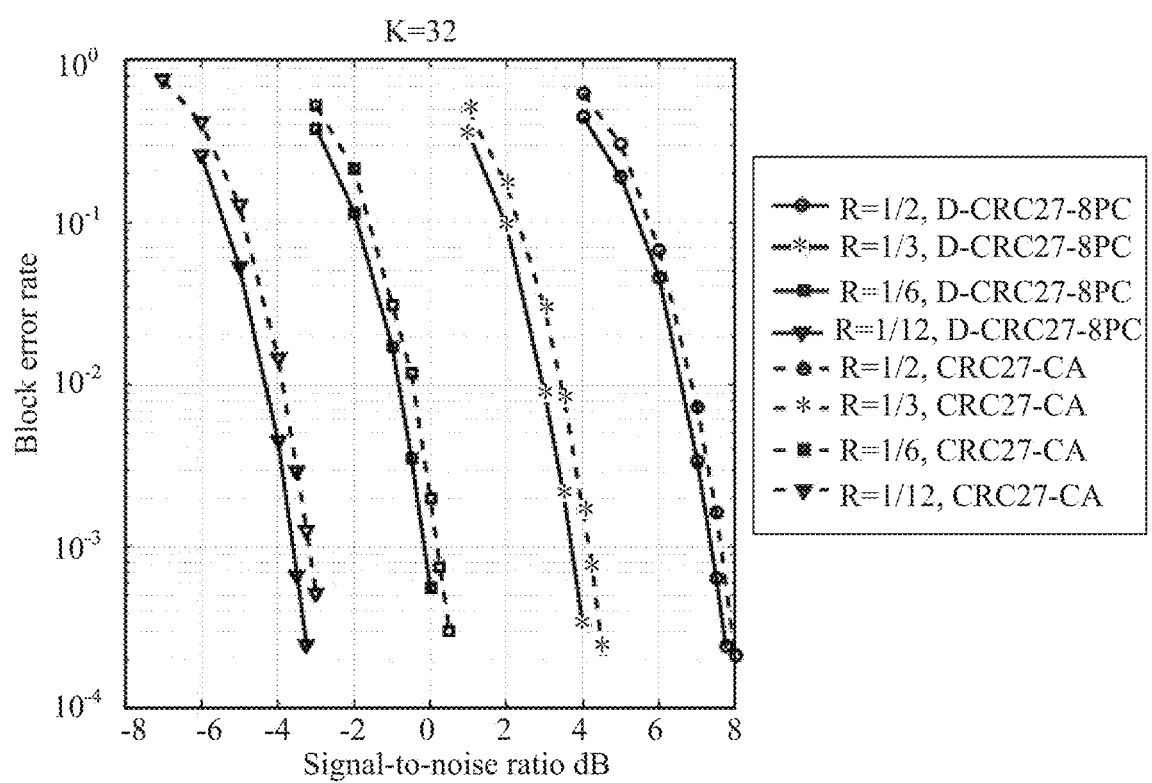
FIG. 17(a) shows comparison between performance of CA-polar in an AWGN channel in a solution of this application and performance of CA-polar in an AWGN channel in a conventional solution when List=8 and K=32.
Figure 17B:
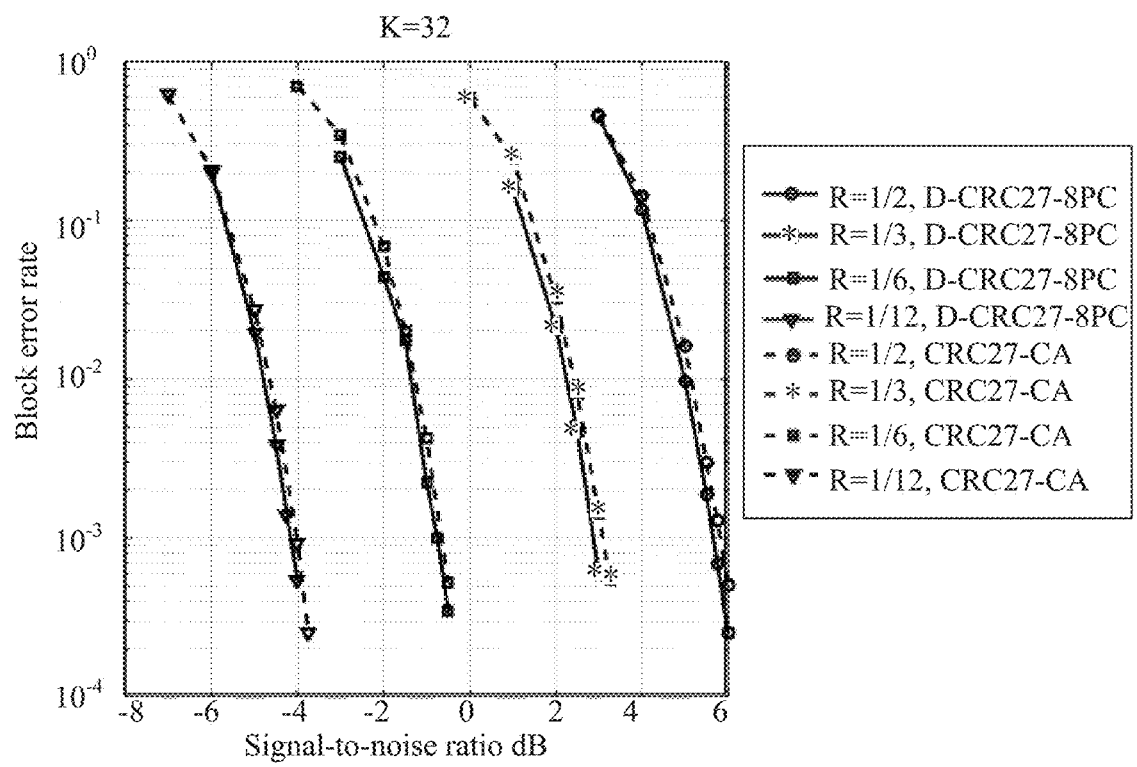
FIG. 17(b) shows comparison between performance of CA-polar in an AWGN channel in a solution of this application and performance of CA-polar in an AWGN channel in a conventional solution when K=48.

FIG. 17(*a*) shows comparison between performance of CA-polar in an AWGN channel in a solution of this application and performance of CA-polar in an AWGN channel in a conventional solution when List=8 and K=32. FIG. 17(*b*) shows comparison between performance of CA-polar in an AWGN channel in a solution of this application and performance of CA-polar in an AWGN channel in a conventional solution when K=48. In conventional CA-polar, all CRC bits are used for a CRC check to perform error correction or error detection. In the solution of this application, a part of CRC bits are interleaved between bits of an information block, all bits of the information block checked are located before the CRC bits, and the part of CRC bits are used as PC bits for decoding. In FIG. 17(*a*) and FIG. 17(*b*), performance curves represented by solid lines are corresponding to a CRC length 27. Eight bits are interleaved and used as PC bits for providing aid for SCL decoding, and remaining CRC bits are used to select a path after the SCL decoding. Dashed lines are corresponding to the CRC length 27, and are all used to select a path after the SCL decoding. It can be learned that in the solution of this application, compared with the CA-polar, a performance gain is greater than 0.4 dB when K=32, and a gain is greater than 0.1 dB when K=48.

Figure 18:
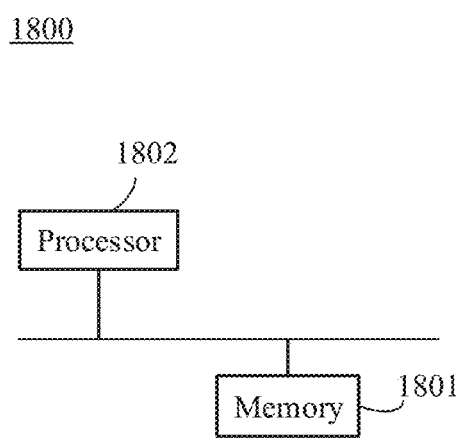
FIG. 18 is a schematic structural diagram of another decoding apparatus according to an embodiment of this application.

A decoding apparatus 1800 shown in FIG. 18 may also be configured to perform a decoding method. The decoding apparatus 1800 includes a memory 1801 and a processor 1802.

The memory 1801 is configured to store a program.

The processor 1802 is configured to: execute the program stored in the memory, and when the program is executed, perform the decoding method shown in FIG. 15. The method includes: obtaining positions of information bits and a frozen bit in to-be-decoded bits, where the information bits include K bits of an information block and Lcrc CRC bits, Lpc CRC bits are located between bits of the information block, each CRC bit of the Lpc CRC bits is located after all bits checked by using the CRC bit, and Lpc is an integer greater than 0 and less than Lcrc; sequentially decoding the to-be-decoded bits by using a successive cancellation list SCL decoding algorithm, and outputting L candidate paths whose metrics are optimal, where in a decoding process, a value of a frozen bit in each candidate path is set to an agreed fixed value, a value of each CRC bit of the Lpc CRC bits is determined based on a value of a bit that is of the information block, that is checked by using the CRC bit, and that is located before the CRC bit, and remaining (Lcrc−Lpc) CRC bits are decoded in a manner of decoding the information bits; de-interleaving T candidate paths whose metrics are optimal in the L candidate paths, where T is an integer greater than 0 and less than or equal to L; and performing a CRC check on the T candidate paths, and using, as decoding output, an information block in a candidate path that passes the CRC check and whose path metric is optimal.

If none of the T candidate paths passes the CRC check, a path whose metric is optimal may be selected as the decoding output, or it may be determined that the decoding fails.

For content such as a quantity Lpc of special CRC bits, an interleaving sequence, a generation method, and a quantity of times of a CRC check, reference may be made to the embodiments of the encoding method and the decoding method. The memory 1801 may be a physically independent unit, or may be integrated into the processor 1802.

The decoding apparatus in FIG. 18 may further include a receiver (not shown in the figure), configured to receive information about the to-be-decoded bits.

Figure 19:
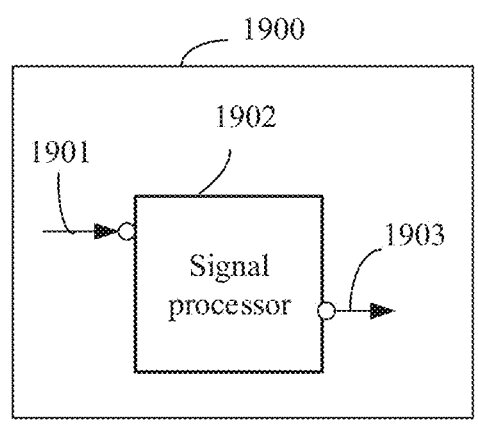
FIG. 19 is a schematic structural diagram of still another decoding apparatus according to an embodiment of this application.

As shown in FIG. 19, this application provides another decoding apparatus 1900 that may implement the decoding method in this application. The decoding apparatus 1900 includes at least one input end 1901, a signal processor 1902, and at least one output end 1903.

The at least one input end 1901 is configured to receive information about to-be-decoded bits.

The signal processor 1902 is configured to: obtain positions of information bits and a frozen bit in the to-be-decoded bits, where the information bits include K bits of an information block and Lcrc CRC bits, Lpc CRC bits are located between bits of the information block, each CRC bit of the Lpc CRC bits is located after all bits checked by using the CRC bit, and Lpc is an integer greater than 0 and less than Lcrc; sequentially decode the to-be-decoded bits by using a successive cancellation list SCL decoding algorithm, and output L candidate paths whose metrics are optimal, where in a decoding process, a value of a frozen bit in each candidate path is set to an agreed fixed value, a value of each CRC bit of the Lpc CRC bits is determined based on a value of a bit that is of the information block, that is checked by using the CRC bit, and that is located before the CRC bit, and remaining (Lcrc–Lpc) CRC bits are decoded in a manner of decoding the information bits; de-interleave T candidate paths whose metrics are optimal in the L candidate paths, where T is an integer greater than 0 and less than or equal to L; and perform a CRC check on the T candidate paths.

The at least one output unit 1903 is configured to use, as decoding output, an information block in a first candidate path that passes the CRC check.

For content such as a quantity Lpc of special CRC bits, an interleaving sequence, a generation method, and a quantity of times of a CRC check, reference may be made to the embodiments of the encoding method and the decoding method.

Optionally, the signal processor 1902 may be implemented by using hardware, for example, a baseband processor, a processing circuit, a decoder, or a decoding circuit.

The decoding apparatus in FIG. 19 may further include a receiver (not shown in the figure), configured to receive the information about the to-be-decoded bits.

The decoding apparatus in this embodiment of this application may be any device with a wireless communications function, for example, an access point, a station, user equipment, or a base station.

The information block described in the embodiments of this application refers to to-be-sent information bits, or may be referred to as an information bit sequence (information bit sequence), a to-be-encoded bit sequence, a data block, data bits, an information bit set, an information bit vector, or the like. Correspondingly, the information block length may be called an information block size, and refers to a quantity of bits in an information bit sequence, a quantity of to-be-encoded bits in a to-be-encoded bit sequence, a quantity of bits in a data block, a quantity of data bits, or a quantity of elements in an information bit set. The encoded block (coded block) described in the embodiments of this application may alternatively be referred to as encoded bits (coded bits), an encoded bit sequence (coded bit sequence), or the like.

The successive cancellation list SCL decoding algorithm described in the embodiments of this application includes another decoding algorithm, similar to the SCL, in which decoding is performed sequentially and that provides a plurality of candidate paths, or an improvement algorithm to the SCL decoding algorithm.

In actual use, the encoding apparatus or the decoding apparatus described in the embodiments of this application may be an independent device or may be an integrated device; and is configured to: encode to-be-sent information and then send encoded information, or decode received information.

In the examples described in the embodiments of this application, units and method processes can be implemented by electronic hardware or a combination of computer software and electronic hardware. Whether the functions are performed by hardware or software depends on particular applications and design constraint conditions of the technical solutions. Persons skilled in the art can implement the described functions by using different methods for each specific application.

In the several embodiments provided in this application, it should be understood that the disclosed apparatus and method may be implemented in other manners. The described apparatus embodiments are merely examples. For example, the unit division is merely logical function division and may be other division during actual implementation. For example, a plurality of units or components may be combined or integrated into another system. Some operations in the method may be ignored or may not be performed. In addition, couplings or direct couplings or communication connections between the units may be implemented by using some interfaces, and these interfaces may be implemented in electronic, mechanical, or other forms.

The units described as separate parts may or may not be physically separate, and may be located in one position or may be distributed on a plurality of network units. In addition, functional units in the embodiments of this application may be integrated into one processing unit, or each of the units may exist alone physically, or two or more units are integrated into one unit.

All or some of the foregoing embodiments may be implemented by using software, hardware, firmware, or any combination thereof. When software is used to implement the embodiments, the embodiments may be implemented completely or partially in a form of a computer program product. The computer program product includes one or more computer instructions. When the computer program instructions are loaded and executed on the computer, the procedures or functions according to the embodiments of the invention are all or partially generated. The computer may be a general-purpose computer, a dedicated computer, a computer network, or another programmable apparatus. The computer instructions may be stored in a computer-readable storage medium, or may be transmitted by using the computer-readable storage medium. The computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible to a computer, or a data storage device, such as a server or a data center, integrating one or more usable media. The usable medium may be a magnetic medium (for example, a floppy disk, a hard disk, a magnetic tape, a USB flash drive, a ROM, or a RAM), an optical medium (for example, a CD or a DVD), a semiconductor medium (for example, a solid state disk (SSD)), or the like.

The foregoing description is merely intended for describing the technical solutions of embodiments of the invention, and is not limiting. Although the technical solutions are described in detail with reference to the foregoing embodiments, persons of ordinary skill in the art should understand that they may still make modifications to the technical solutions described in the foregoing embodiments or make equivalent replacements to some technical features thereof. However, these modifications or replacements do not make the essence of corresponding technical solutions depart from the scope of the technical solutions in the embodiments of the invention.

What is claimed is:

1. A polar encoding method, comprising:
performing, by a processor, cyclic redundancy check (CRC) encoding on an information block to obtain a CRC encoded block with a length of B, wherein a CRC length is Lcrc, an information block length is K, and B=K+Lcrc;
interleaving, by the processor, the CRC encoded block, wherein Lpc CRC bits in an interleaved encoded block are located between bits of the information block, each CRC bit of the Lpc CRC bits is located after all bits checked by using the CRC bit, and Lpc is an integer greater than 0 and less than Lcrc;
mapping, by the processor, the interleaved encoded block to positions of information bits,
setting, by the processor, a frozen bit to an agreed fixed value, and
performing, by the processor, polar encoding on the information bits and the frozen bit to obtain a polar encoded codeword, wherein positions of the information bits and the frozen bit are obtained based on reliabilities of polarized channels.

2. The method according to claim 1, wherein the interleaving the CRC encoded block comprises:
interleaving the CRC encoded block by using an interleaving sequence $\pi=[\pi_1, \pi_2, \ldots, \pi_n]$, and permuting a CRC encoded bit sequence [b1, b2, . . . , bn] into $b\pi_1$, $b\pi_2, \ldots, b\pi_n$, wherein n is an integer greater than 0 and less than or equal to B, and a value of $\pi_n$ represents a bit position sequence number that is of an $n^{th}$ bit of the interleaved encoded block and that is in the CRC encoded block before the interleaving is performed.

3. The method according to claim 1, wherein Lpc meets the following condition:

$$L_{pc} \leq L_{crc} - \log_2 T + \log_2 FAR,$$

and wherein
T represents a pre-agreed quantity of candidate paths for selecting a decoding result through CRC check during decoding, and FAR represents a false alarm rate upper limit specified in a communications system.

4. The method according to claim 1, wherein Lcrc and Lpc meet the following relationship: Lcrc−Lpc=10; or Lcrc−Lpc=18.

5. The method according to claim 1, wherein Lpc=1 and Lcrc=11; Lpc=2 and Lcrc=12; Lpc=4 and Lcrc=14; Lpc=6 and Lcrc=16; or Lpc=8 and Lcrc=18.

6. The method according to claim 1, wherein Lpc=1 and Lcrc=19; Lpc=2 and Lcrc=20; Lpc=4 and Lcrc=22; Lpc=6 and Lcrc=24; or Lpc=8 and Lcrc=26.

7. An encoding apparatus, comprising:
a memory, configured to store a program; and
a processor, configured to execute the program stored in the memory, wherein when the program is executed, the processor is configured to: perform cyclic redundancy check CRC encoding on an information block to obtain a CRC encoded block with a length of B, wherein a CRC length is Lcrc, an information block length is K, and B=K+Lcrc; interleave the CRC encoded block, wherein Lpc CRC bits in an interleaved encoded block are located between bits of the information block, each CRC bit of the Lpc CRC bits is located after all bits checked by using the CRC bit, and Lpc is an integer greater than 0 and less than Lcrc; map the interleaved encoded block to information bits; set a frozen bit to an agreed fixed value, and perform polar encoding on the information bits and the frozen bit to obtain a polar encoded codeword, wherein positions of the information bits and the frozen bit are obtained based on reliabilities of polarized channels.

8. The apparatus according to claim 7, wherein Lpc meets the following condition:

$$L_{pc} \leq L_{crc} - \log_2 T + \log_2 FAR,$$

and wherein
T represents a pre-agreed quantity of candidate paths for selecting a decoding result through CRC check during decoding, and FAR represents a false alarm rate upper limit specified in a communications system.

9. The apparatus according to claim 7, wherein Lcrc and Lpc meet the following relationship: Lcrc−Lpc=10; or Lcrc−Lpc=18.

10. The apparatus according to claim 7, wherein Lpc=1 and Lcrc=11; Lpc=2 and Lcrc=12; Lpc=4 and Lcrc=14; Lpc=6 and Lcrc=16; or Lpc=8 and Lcrc=18.

11. The apparatus according to claim 7, wherein Lpc=1 and Lcrc=19; Lpc=2 and Lcrc=20; Lpc=4 and Lcrc=22; Lpc=6 and Lcrc=24; or Lpc=8 and Lcrc=26.

12. A polar decoding method, comprising:
receiving to-be-decoded bits;
obtaining, by a processor, positions of information bits and a frozen bit in the to-be-decoded bits, wherein the information bits comprise K bits of an information block and Lcrc cyclic redundancy check CRC bits, Lpc CRC bits are located between bits of the information block, each CRC bit of the Lpc CRC bits is located after all bits checked by using the CRC bit, and Lpc is an integer greater than 0 and less than Lcrc;
decoding, by the processor, the to-be-decoded bits, based on the positions of the information block and the CRC bits.

13. The method according to claim 12, wherein Lpc, Lcrc, T, and a false alarm rate FAR upper limit that is specified in a communications system meet the following relationship:

$$L_{pc} \leq L_{crc} - \log_2 T + \log_2 FAR,$$

T represents a pre-agreed quantity of candidate paths for selecting a decoding result through CRC check during decoding, and FAR represents a false alarm rate upper limit specified in a communications system.

14. The method according to claims 12, wherein Lcrc and Lpc meet the following relationship: Lcrc−Lpc=10; or Lcrc−Lpc=18.

15. A decoding apparatus, comprising:
a memory; and
a processor coupled to the memory, wherein the processor is configured to: receive to-be-decoded bits;
obtain positions of information bits and a frozen bit in the to-be-decoded bits, wherein the information bits comprise K bits of an information block and Lcrc cyclic redundancy check CRC bits, Lpc CRC bits are located between bits of the information block, each CRC bit of the Lpc CRC bits is located after all bits checked by using the CRC bit, and Lpc is an integer greater than 0 and less than Lcrc;

decode the to-be-decoded bits, based on the positions of the information block and the CRC bits.

16. The apparatus according to claim 15, wherein Lpc, Lcrc, T, and a false alarm rate FAR upper limit that is specified in a communications system meet the following relationship:

$$L_{pc} \leq L_{crc} - \log_2 T + \log_2 FAR,$$

T represents a pre-agreed quantity of candidate paths for selecting a decoding result through CRC check during decoding, and FAR represents a false alarm rate upper limit specified in a communications system.

17. The apparatus according to claim 15, wherein Lcrc and Lpc meet the following relationship: Lcrc−Lpc=10; or Lcrc−Lpc=18.

\* \* \* \* \*